US006809968B2

(12) United States Patent
Marr et al.

(10) Patent No.: US 6,809,968 B2
(45) Date of Patent: Oct. 26, 2004

(54) SRAM ARRAY WITH TEMPERATURE-COMPENSATED THRESHOLD VOLTAGE

(75) Inventors: Kenneth W. Marr, Boise, ID (US); John D. Porter, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/368,068

(22) Filed: Feb. 18, 2003

(65) Prior Publication Data

US 2003/0151956 A1 Aug. 14, 2003

Related U.S. Application Data

(62) Division of application No. 09/940,968, filed on Aug. 28, 2001, now Pat. No. 6,529,421.

(51) Int. Cl.[7] .............................................. G11C 7/00
(52) U.S. Cl. ........................ 365/185.24; 365/185.25; 365/182.27; 365/185.18
(58) Field of Search ...................... 365/185.01, 185.24, 365/185.25, 185.27, 185.18

(56) References Cited

U.S. PATENT DOCUMENTS

| 4,358,728 | A | * | 11/1982 | Hashimoto ................. 323/275 |
|---|---|---|---|---|
| 4,887,181 | A | * | 12/1989 | Lenz ......................... 361/103 |
| 5,327,262 | A | * | 7/1994 | Williams .................... 358/462 |
| 5,475,633 | A | | 12/1995 | Mehalel ...................... 365/154 |
| 5,483,184 | A | * | 1/1996 | Kuo ............................ 327/83 |
| 5,602,790 | A | | 2/1997 | Mullarkey .................. 365/211 |
| 5,646,516 | A | * | 7/1997 | Tobita ........................ 323/313 |
| 5,698,877 | A | | 12/1997 | Gonzalez ................... 257/299 |
| 5,745,414 | A | | 4/1998 | Engh et al. ............... 365/185.2 |
| 5,793,691 | A | | 8/1998 | Mullarkey .................. 365/211 |
| 5,844,853 | A | | 12/1998 | Kitsukawa et al. ......... 365/226 |
| 5,914,629 | A | * | 6/1999 | Maki ......................... 327/512 |

(List continued on next page.)

OTHER PUBLICATIONS

Noda, K, et al., "A 1.9–im2 loadless CMOS four–transistor SRAM cell in a 0.18–im logic technology", *IEDM '98 Technical Digest., International Electron Devices*, Meeting, (Dec. 6–9, 1998), 643–646.

Takeda, K, et al., "A 16 Mb 400 MHz loadless CMOS four–transistor SRAM macro", *IEEE International Solid–State Circuits Conference, 2000. Digest of Technical Papers. ISSCC.*, (Feb. 7–9, 2000), 264–265.

*Primary Examiner*—Viet Q. Nguyen
(74) *Attorney, Agent, or Firm*—Schwegman, Lundberg, Woessner & Kluth, P.A.

(57) ABSTRACT

Systems and methods are provided for a temperature-compensated threshold voltage $V_T$. The stability problems associated with temperature changes are reduced for LL4TCMOS SRAM cells by providing a temperature-compensated $V_{TN}$. According to one embodiment, a temperature-based modulation of a $V_{BB}$ potential back-biases a triple-well transistor with a temperature-compensated voltage to provide the pull-down transistor with a temperature-compensated $V_{TN}$ that is flat or relatively flat with respect to temperature. One embodiment provides a bias generator, including a charge pump coupled to a body terminal of the transistor(s), and a comparator coupled to the charge pump. The comparator includes a first input that receives a reference voltage, a second input that receives a $V_T$-dependent voltage, and an output that presents a control signal to the charge pump and causes the charge pump to selectively charge the body terminal of the transistor to compensate for temperature changes.

24 Claims, 16 Drawing Sheets

U.S. PATENT DOCUMENTS

| | | | |
|---|---|---|---|
| 5,959,323 A | 9/1999 | Gonzalez | 257/299 |
| 6,055,186 A | 4/2000 | Hung et al. | 365/185.18 |
| 6,366,156 B1 | 4/2000 | Narendra et al. | 327/534 |
| 6,087,893 A | 7/2000 | Oowaki et al. | 327/537 |
| 6,111,282 A | 8/2000 | Gonzalez | 257/299 |
| 6,147,479 A * | 11/2000 | Lee | 323/313 |
| 6,147,511 A | 11/2000 | Patel et al. | 326/81 |
| 6,177,807 B1 | 1/2001 | Bertin et al. | 326/30 |
| 6,232,827 B1 | 5/2001 | De et al. | 327/537 |
| 6,268,763 B1 | 7/2001 | Fujikawa | 327/538 |
| 6,285,242 B1 | 9/2001 | Hardee | 327/536 |
| 6,529,421 B1 * | 3/2003 | Marr et al. | 365/189.09 |
| 6,584,030 B2 | 6/2003 | Marr | 365/226 |
| 6,643,192 B2 | 11/2003 | Marotta et al. | 365/189.02 |
| 6,654,275 B2 | 11/2003 | Forbes | 365/154 |
| 6,687,161 B2 | 2/2004 | Marotta et al. | 365/185.21 |
| 2002/0024308 A1 * | 2/2002 | Knono | 327/541 |
| 2002/0033720 A1 * | 3/2002 | Ikehashi et al. | 327/143 |
| 2002/0079973 A1 * | 6/2002 | Higashi et al. | 331/16 |
| 2002/0131294 A1 | 9/2002 | Forbes | 365/154 |
| 2003/0043640 A1 | 3/2003 | Marr et al. | 365/189.09 |
| 2003/0043677 A1 | 3/2003 | Marr | 365/226 |
| 2003/0151956 A1 | 8/2003 | Marr et al. | 365/189.09 |

* cited by examiner

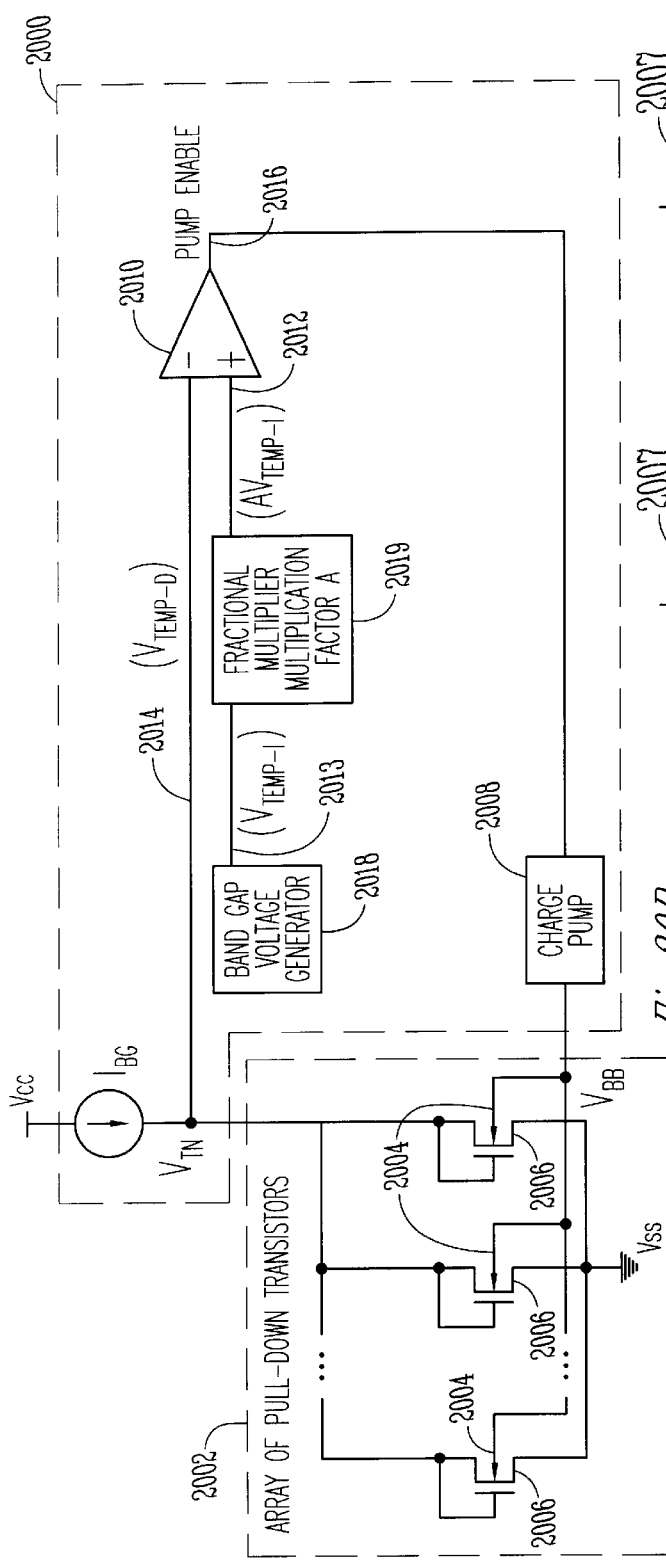
Fig.20B
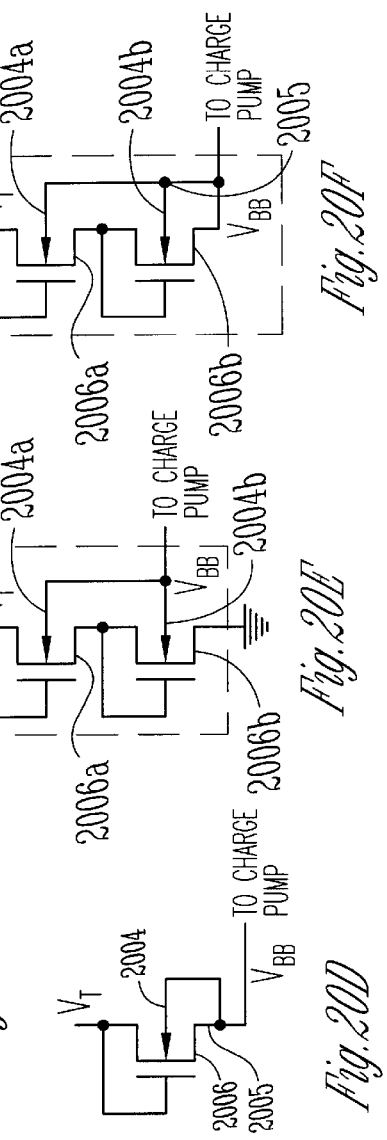
Fig.20E
Fig.20F
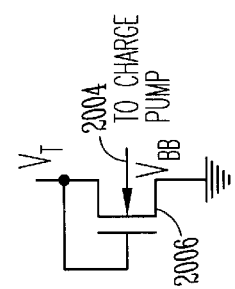
Fig.20C
Fig.20D

US 6,809,968 B2

SRAM ARRAY WITH TEMPERATURE-COMPENSATED THRESHOLD VOLTAGE

RELATED APPLICATION

This application is a Divisional of a U.S. application Ser. No. 09/940,968 filed on Aug. 28, 2001 now U.S. Pat. No. 6,529,421 which is incorporated herein by reference.

TECHNICAL FIELD OF THE INVENTION

This invention relates generally to Static Random Access Memory (SRAM) devices and, more particularly, to SRAM devices that utilize a loadless four transistor design.

BACKGROUND OF THE INVENTION

Manufacturers are designing smaller and more power efficient integrated circuits by improving CMOS processes and reducing device dimensions. Scaling is the process of modeling the changes in electrical behavior that result from reducing the device dimensions. In constant field scaling, for example, the voltage is scaled down as the device dimensions are reduced. Maintaining proper circuit operation by maintaining the appropriate stability margin is a design concern as the voltage is decreased. Many of these integrated circuits include arrays of SRAM cells. Failure to maintain the appropriate stability margin in a SRAM cell may result in a failure to retain data in the cell, a change in the data state of the cell while reading, or in an accidental write to the cell.

SRAM cell designs have progressed from a four transistor SRAM cell illustrated in FIG. 1 and a six transistor SRAM cell illustrated in FIG. 2 to a loadless four transistor SRAM cell illustrated in FIG. 3. The four transistor SRAM cell or NMOS resistor load cell, hereinafter referred to as the 4-T SRAM cell, occupies a relatively small area, but the fabrication of the passive loads involves relatively complex steps. Additionally, the 4-T SRAM cell can inadvertently become monostable or read unstable rather than maintaining its bistable characteristics. This stability problem has caused the 4-T SRAM to lose favor in SRAM cell design during the past few years. The six transistor SRAM cell, hereinafter referred to as the 6-T SRAM cell, is relatively stable and is able to operate at lower supply voltages than the 4-T SRAM. However, the 6-T SRAM cell is approximately 30% to 40% larger than the 4-T SRAM cell, and thus more expensive.

The problems associated with the 4-T SRAM cell and the 6-T SRAM cell have led to the development of the loadless four transistor SRAM cell, hereinafter referred to as the LL4TCMOS SRAM cell. The LL4TCMOS SRAM cell comprises a pair of NMOS pull-down transistors and a pair of PMOS access transistors. The LL4TCMOS SRAM is relatively small, although it is not as small as the 4-T SRAM cell as it incorporates CMOS devices. However, the LL4TCMOS SRAM cell design suffers from data retention and unintentional write problems such as failures attributable to the effects of leakage current and to the effects of noise.

The fundamental lower limit for the voltage scaling of the LL4TCMOS SRAM is dependent on the inherent transistor threshold voltage $V_{TN}$ drop for the NMOS pull-down transistors in the design of the LL4TCMOS SRAM cell. The cell must have sufficient voltage to maintain the stability margin over the pull-down $V_{TN}$. The pull-down $V_{TN}$ decreases with an increase in temperature at a rate of approximately −4 mV per degree C. for high substrate doping levels and −2 mV/degree C. for low doping levels. These temperature variations pose a stability problem for low-voltage LL4TCMOS SRAM arrays. A higher pull-down $V_{TN}$ at lower temperatures may provide a voltage drop that causes an unacceptably low stability margin for an LL4TCMOS SRAM cell that is operating at a low voltage; and a lower pull-down $V_{TN}$ at higher temperatures increases leakage currents in the cell that can lead to data retention problems and yield loss.

Therefore, there is a need in the art to provide a system and method that overcomes these problems.

SUMMARY OF THE INVENTION

The above mentioned problems are addressed by the present subject matter and will be understood by reading and studying the following specification. The present subject matter provides a circuit with a transistor having a temperature-compensated threshold voltage, i.e. $V_T$, and particularly provides a low-voltage LL4TCMOS SRAM array of cells that include NMOS pull-down transistors with a temperature-compensated $V_{TN}$.

An increase in temperature significantly increases the leakage current and decreases the $V_{TN}$ in a LL4TCMOS SRAM cell, which causes significant data retention problems for the cell. According to one embodiment of the present invention, each NMOS pull-down transistor comprises a triple-well transistor, and the threshold voltage $V_T$ thereof is adjusted to compensate for changes in temperature. A temperature-based modulation of the $V_{BB}$ potential back-biases the P-well of the triple-well transistor with a temperature-compensated voltage to provide the pull-down transistor with a temperature-compensated $V_{TN}$ that is flat or relatively flat with respect to temperature. Thus, the LL4TCMOS SRAM cells that include a temperature-compensated $V_{TN}$ will maintain the appropriate margins of failure at low-voltage operation over a range of temperatures.

One aspect of the present invention is a transistor body bias generator. One embodiment of the generator comprises a charge pump and a comparator. According to this embodiment, the charge pump is coupled to a body terminal of at least one triple-well transistor, and the comparator is coupled to the charge pump. The comparator includes a first input, a second input, and an output. The first input receives a temperature-independent reference voltage. The second input receives a $V_T$-dependent voltage from the transistor(s), and the output presents a control signal to the charge pump based on the comparison between the temperature-independent reference voltage and the $V_T$-dependent voltage. The charge pump selectively charges the body terminal of the triple-well transistor(s) in response to the control signal.

These and other aspects, embodiments, advantages, and features will become apparent from the following description of the invention and the referenced drawings.

BRIEF DESCRIPTION OF THE DRAWINGS

FIG. 10 illustrates a half latch of a LL4TCMOS SRAM cell in which data is being written to or read from.

FIG. 20B illustrates a block diagram for another embodiment of a transistor body bias generator coupled to an array of pull-down transistors within a SRAM array.

FIG. 20C illustrates one biasing arrangement for a pull-down transistor.

FIG. 20D illustrates another biasing arrangement for a pull-down transistor.

FIG. 20E illustrates another biasing arrangement for a pull-down transistor.

FIG. 20F illustrates another biasing arrangement for a pull-down transistor.

DETAILED DESCRIPTION OF THE INVENTION

Figure 1:
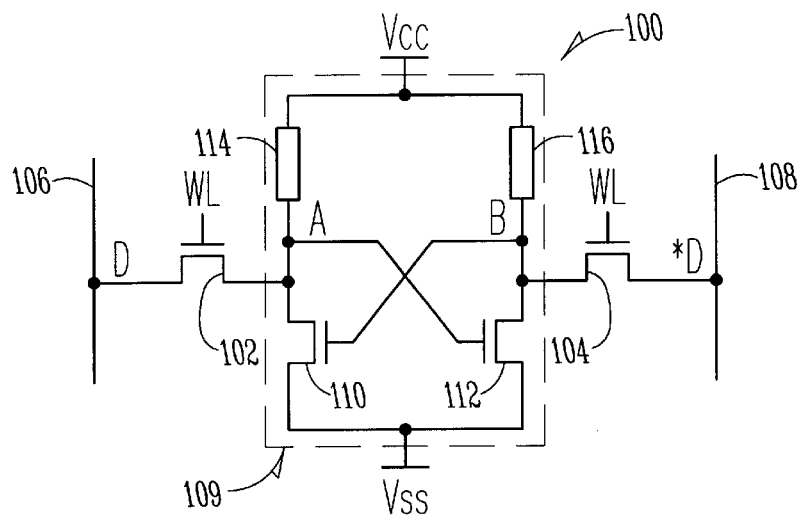
FIG. 1 is a circuit diagram of a 4-T SRAM cell.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter provides a temperature-based compensation for the threshold voltage $V_T$ of a transistor, and particularly for the pull-down NMOS transistors of LL4TCMOS SRAM cells. An increase in temperature results in data retention problems for conventional LL4TCMOS SRAM cells. According to the present invention, the SRAM cells are fabricated with triple-well NMOS transistors, and a temperature-based modulation of the $V_{BB}$ potential provides the NMOS pull-down transistors with a temperature-compensated threshold voltage $V_{TN}$ that is flat or relatively flat with respect to temperature. As such, the stability margin of the LL4TCMOS SRAM cells is maintained through a range of temperatures.

Figure 2:
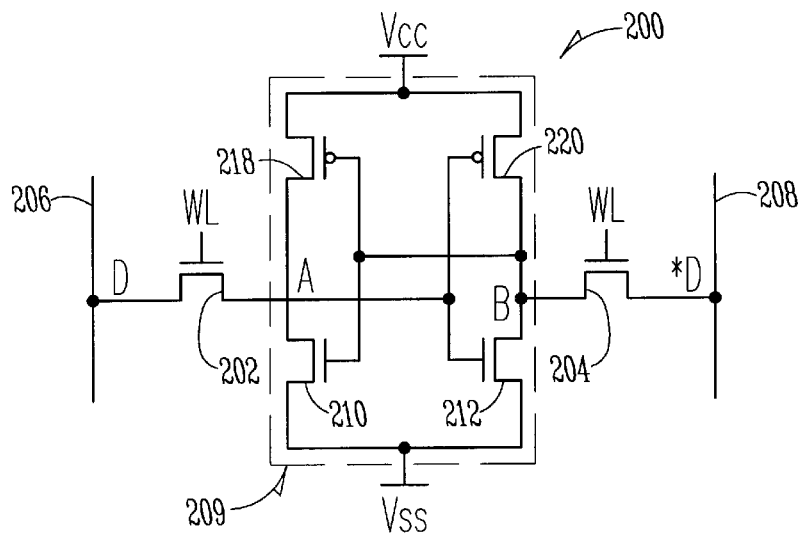
FIG. 2 is a circuit diagram of a 6-T SRAM cell.
Figure 3:
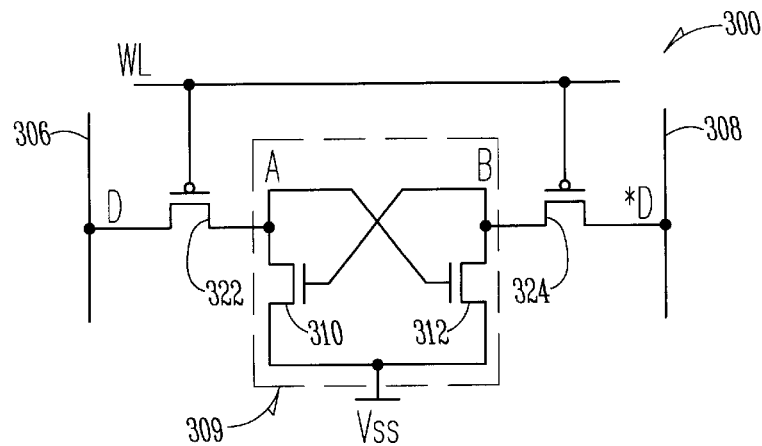
FIG. 3 is a circuit diagram of a LL4TCMOS SRAM cell.

FIGS. 1, 2 and 3 illustrate the progression of SRAM cell design from a 4-T SRAM cell and 6-T SRAM cell to the LL4TCMOS SRAM cell. Each of these cell designs have problems or potential problems. FIG. 1 is a circuit diagram of a conventional 4-T SRAM cell 100. A pair of NMOS access transistors 102 and 104 allow complementary bit values D and *D on the digit lines 106 and 108 to be read from and to be written to a storage circuit 109 of the cell 100. The storage circuit 109 includes NMOS pull-down transistors 110 and 112. Nodes A and B are the complementary inputs/outputs of the storage circuit 109, and the respective complementary logic values at these nodes represent the state of the cell. For example, when the node A is at logic 1 and the node B is at logic 0, then the cell is storing a logic 1. Conversely, when the node A is at logic 0 and the node B is at logic 1, then the cell is storing a logic 0. The cell 100 is bistable as it can have one of two stable states, i.e. logic 1 or logic 0.

During a read of the cell, a word line WL, which is coupled to the gates of the access transistors 102 and 104, is driven to a voltage approximately equal to Vcc to activate the transistors. For example, assume that $V_{CC}$=logic 1=2.5V and Vss=logic 0=0V, and that at the beginning of the read, the cell 100 is storing a logic 0 such that the voltage level at the node A is 0V and the voltage level at the node B is 2.5V. As this is an example, it is noted that Vcc may be scaled lower than 2.5V. The NMOS access transistor 102 couples the node A to the digit line 106, and the NMOS access transistor 104 couples the node B to the digit line 108. The digit lines 106 and 108 have a capacitance. Due to the high voltage at node B, the current flow from the node A to ground through NMOS pull-down transistor 110 pulls down the digit line 106. Digit line 108 is not pulled down because, due to the low voltage at node A, there is not a current flow from the node B to ground through NMOS pull-down transistor 112. The resulting bit line differential allows a sense amp to read the stored logic value of the cell.

During a write of a logic 1 to the cell 100, the access transistors 102 and 104 are activated as discussed above, and logic 1 is driven onto the digit line 106 and a logic 0 is driven onto the digit line 108. The transistor 102 couples 1.5V (the 2.5V on the digit line 106 minus the 1V threshold of the transistor 102) to the node A, and the transistor 104 couples 0V from the digit line 108 to the node B. The low voltage on the node B turns off the NMOS transistor 110. A write can occur within a time frame on the order of nanoseconds. The inactive NMOS transistor 110 allows node A to be pulled up by the access device 102 to $V_{CC}$-$V_T$, because the time constant of the passive load 114 is on the order of milliseconds, and thus is too long to contribute to the restoration of a high voltage. This high voltage on the node A turns on the NMOS transistor 112, and allows the NMOS transistor 112 to reinforce the logic 0 on the node B. Likewise, if the voltage written to the node B is 1.5V and the voltage written to the node A is 0V, the positive-feedback configuration ensures that the cell will store a logic 0.

The 4-T SRAM cell 100 includes conventional passive loads 114 and 116 that pull up the voltage at one of the nodes A or B if the associated NMOS pull-down transistor for that node is inactive. Polysilicon resistors form these passive loads 114 and 116 in one embodiment. The loads 114 and 116 are usually built in another level above the access transistors 102 and 104 and the NMOS pull-down transistors 110 and 112. Thus, the 4-T cell occupies a small area, which results in reduced cost. However, complex steps are required to form the load elements 114 and 116 such that the construction of the 4-T cells presents a complexity versus cost tradeoff. The resistive loads 114 and 116 do not play a significant role in determining read stability because, during a read, a low voltage at a node is probably large enough that, if the low voltage is applied to a gate of a cross-coupled transistor, the voltage can cause the cross-coupled transistor to operate, at least partially, in the subthreshold region. The threshold voltage of the access devices 102 and 104 hurts stability because, when a node is at a high voltage, a voltage drop attributable to the threshold voltage occurs. Therefore, the high voltage $V_H$ at node A or node B is characterized by the relation $V_H$=$V_{CC}$-$V_T$. Thus, under certain conditions as will be described in more detail below with respect to the stability margin curves of FIGS. 11A–11C, the 4-T SRAM cell 200 can inadvertently become monostable or read unstable instead of maintaining a desired bistable characteristic. Also, the 4-T SRAM cell 100 consumes a considerable amount of power because there is always current flowing from Vcc to Vss either through the load 114 and the NMOS pull-down transistor 110 or through the load 116 and the NMOS pull-down transistor 112.

FIG. 2 is a circuit diagram of a conventional 6-T SRAM cell 200. Elements common to FIGS. 1 and 2 are referenced with like numbers. Rather than using passive pull-up loads 114 and 116 as does the 4-T SRAM cell 100 of FIG. 1, the 6-T SRAM cell 200 uses PMOS pull-up transistors 218 and 220 in conjunction with the NMOS pull-down transistors 210 and 212 to form the storage circuit 209. For example, during a write of a logic 1 to the 6-T SRAM cell 200, the transistors 202 and 204 are activated as discussed above, and a logic 1 is driven onto the digit line 206 and a logic 0 is driven onto the digit line 208. Thus, in an embodiment where $V_{CC}$=2.5V, the transistor 202 couples 1.5V (the 2.5V on the digit line 206 minus the 1V threshold of the transistor 202) to the node A, and the transistor 204 couples 0V from the digit line 208 to the node B. The low voltage on the node B turns off the NMOS pull-down transistor 210, and turns on the PMOS transistor 218. Thus the inactive NMOS transistor 210 allows the PMOS transistor 218 to pull the node A up to 2.5V. Additionally, the access transistor 202 assists with pulling the node A up to $V_{CC}$-$V_T$, i.e. 1.5V. This high voltage on the node A turns on the NMOS transistor 212 and turns off the PMOS transistor 220, thus allowing the NMOS transistor 212 to reinforce the logic 0 on the node B. Likewise, if the voltage written to the node B is 1.5V and that written to the node A is 0V, the positive-feedback configuration ensures that the 6-T SRAM cell 200 will store a logic 0.

Because the PMOS transistors 218 and 220 have low on resistances (typically on the order of a few kOhms), they can pull the respective nodes A and B virtually all the way up to $V_{CC}$, and thus render the 6-T SRAM cell 200 relatively stable and allow the cell 200 to operate at a lower supply voltage than the 4-T SRAM cell 100 of FIG. 1. The 6-T SRAM cell 200 is relatively stable because the high voltage $V_H$ is $V_{CC}$ rather than $V_{CC}$-$V_T$ as is the case for the 4-T SRAM cell. The power consumption is rather low for the 6-T SRAM cell 200 as, in contrast to the 4-T SRAM cell 100, the current flow from Vcc to Vss in the 6-T SRAM cell 200 is always blocked by one of the NMOS/PMOS pairs. However, the six transistor CMOS design causes the 6-T SRAM cell 200 to be approximately 30% to 40% larger than the NMOS design of the 4-T SRAM cell 100, and thus more expensive.

The problems associated with the 4-T SRAM cell 100 and the 6-T SRAM cell 200 have led to the development of the LL4TCMOS SRAM cell. FIG. 3 is a circuit diagram of a conventional LL4TCMOS SRAM cell 300, where elements common to FIGS. 1, 2 and 3 are referenced with like numerals. A difference between the LL4TCMOS SRAM cell 300 of FIG. 3 and the 4-T SRAM cell 100 of FIG. 1 is the elimination of the load elements 114 and 116 and the replacement of NMOS access transistors 102 and 104 with PMOS access transistors 322 and 324. The LL4TCMOS SRAM cell 300 is relatively small, but is larger than the 4-T SRAM cell 100 as it incorporates CMOS devices.

However, as provided below, the conventional LL4TCMOS SRAM cell design suffers from stability margin (write noise margin) problems under low voltage operation. The relationship between the size of the access transistors 322 and 324 and the size of the pull-down transistors 310 and 312 is a factor in SRAM cell design, and is referred to as the Beta ratio. The Beta ratio is the ratio of the Beta for the PMOS access transistors 322 and 324 and the NMOS pull-down transistors 310 and 312. The Beta ratio implies an impedance ratio that affects the available voltage at nodes A and B, and thus the margins of failure for the cell 300. A data retention failure can occur because of the effect of leakage currents in the SRAM cell and the effect of noise.

Leakage currents are generated by the NMOS pull-down transistors 310 and 312. These currents can include off-state subthreshold device leakage as well as reverse-biased junction leakages. One of the two transistors 310 or 312 always will be inactive as they are cross-coupled to form the storage circuit 309. The cell 300 may flip states if there is more leakage current out of the node than is being supplied to the node by the load element. In order to prevent the LL4TCMOS SRAM cell 300 from losing too much charge at one of the nodes A or B and from spontaneously changing state as a result, the PMOS access transistors 322 and 324 must source sufficient current from the digit lines 306 and 308 to offset the leakage currents. The required offset current can vary over several orders of magnitude due to temperature and process variations. The parasitic device leakage current may rise approximately 1.3 mV per degree C., for example. If the NMOS pull-down transistors 310 and 312 have a high threshold voltage $V_{TN}$ to minimize leakage current, the SRAM cell 300 may lose its stability margin, i.e. the write noise margin. If the transistors 310 and 312 have a low threshold voltage $V_{TN}$, the leakage current is too large at hot temperatures, which may result in data retention failures.

Wide temperature variations resulting from cold-data retention testing and burn-in testing cause wide variations in leakage and subthreshold currents. Such testing, coupled with normal process variations, sense amp margin requirements, and yield requirements such as read/write stability requirements and power consumption requirements, have made the manufacturing of LL4TCMOS SRAM devices a difficult matter.

Figure 4:
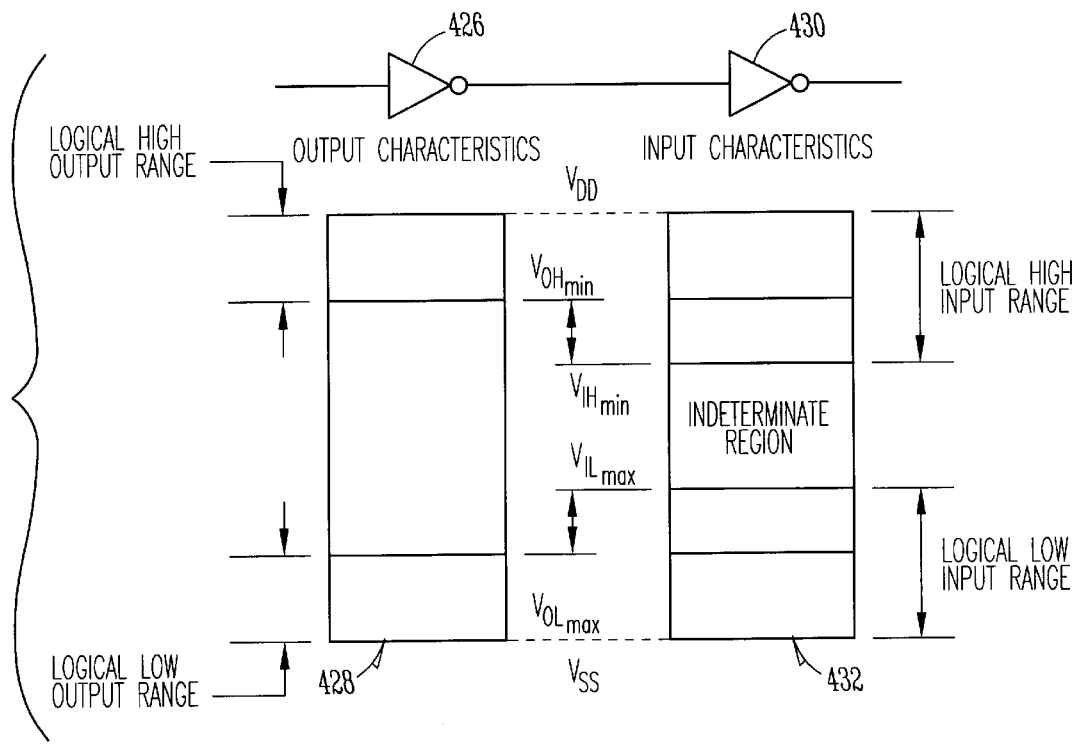
FIG. 4 illustrates signal noise margin for the purpose of developing the static noise margin (SNM) concept.
Figure 6:
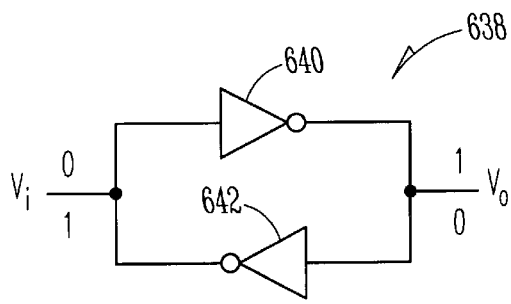
FIG. 6 illustrates a latch that comprises two inverters.
Figure 9:
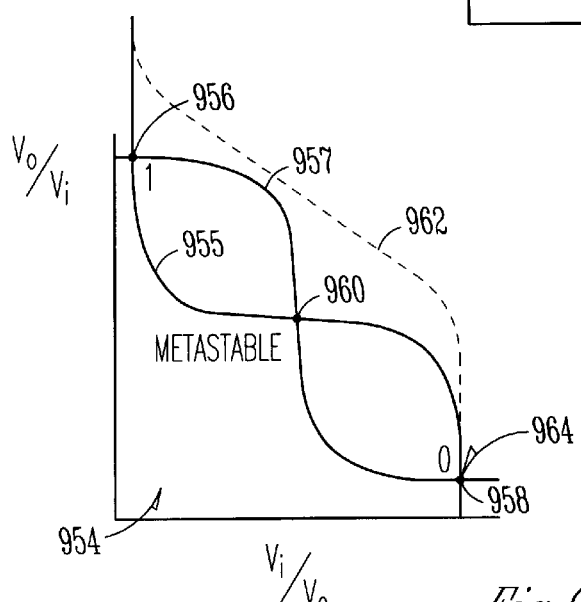
FIG. 9 illustrates a stability margin and provides a dotted line to illustrate a stability failure that results in a monostable circuit.

FIG. 4 illustrates signal noise margin for a simple driving gate and receiving gate, after which the signal noise margin concept will be developed into the stability margin concept for latches or memory cells in connection with FIGS. 6 and 9. Noise margin indicates the allowable noise voltage at an input that will not affect the output. A first or driving gate 426 provides output characteristics 428 and a second or receiving gate 430 provides input characteristics 432. A low noise margin $NM_L$, is defined as the difference in magnitude between the maximum low output voltage $V_{OLmax}$ of the driving gate 426 and the maximum input low voltage $V_{ILmax}$ recognized by the receiving gate 430. A high noise margin $NM_H$ is defined as the difference in magnitude between the minimum high output voltage $V_{OHmin}$ of the driving gate 426 and the minimum input high voltage $V_{IHmin}$ recognized by the receiving gate 430. Larger noise margins $NM_L$ and $NM_H$ result in a more stable circuit that is resistant to noise.

Figure 5:
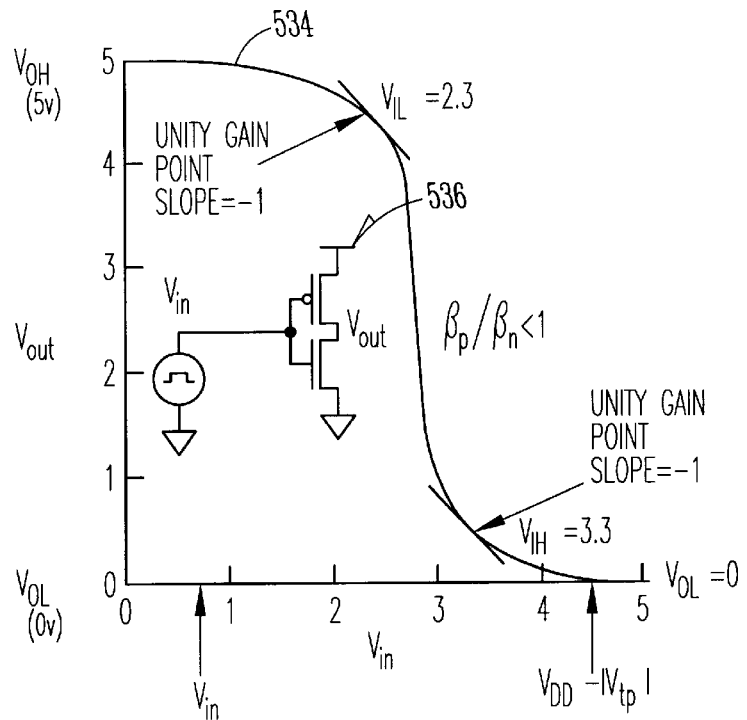
FIG. 5 illustrates transfer characteristics for a CMOS inverter.

FIG. 5 illustrates, for the purposes of example only, the transfer characteristic 534 for a typical CMOS inverter 536, and provides corresponding references to the voltage levels: $V_{OLmax}$, $V_{ILmax}$, $V_{OHmin}$, and $V_{IHmin}$. As the input of the inverter 536 is swept from a low voltage to a high voltage, the output of the inverter 536 makes a transition from a high voltage to low voltage as shown by the transfer curve. As will be developed in FIGS. 6–9, the transfer curve of the inverter forms a building block of the stability margin of a latch or memory circuit.

Figure 7:
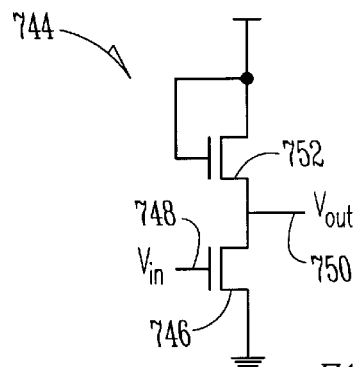
FIG. 7 illustrates a transistor circuit for a half latch, i.e. one of the inverters in the latch of FIG. 6.
Figure 8:
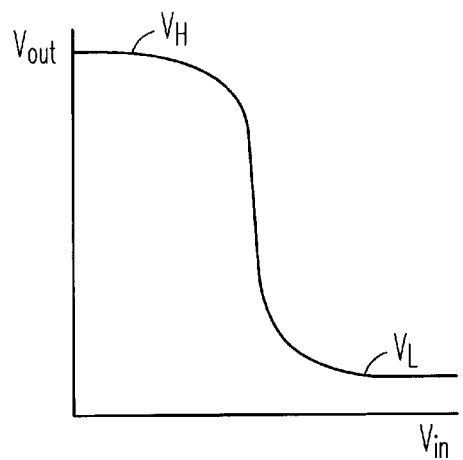
FIG. 8 illustrates a transfer characteristic for the circuit of FIG. 7.

FIG. 6 illustrates conventional logic circuitry for a latch 638 comprised of two complementary inverters 640 and 642. FIG. 7 illustrates a transistor circuit 744 for one of the inverters 640 or 642 in the conventional latch 638, or in other words, for a half-latch. The circuit 744 comprises a first NMOS transistor 746 with a gate connected to an input line 748, a drain connected to an output line 750, and a source connected to a ground or substrate voltage. The circuit further comprises a second diode-connected NMOS transistor 752 with a source connected to the output line 750, a drain connected to $V_{CC}$, and a gate connected to the drain. FIG. 8 illustrates a transfer characteristic for the half-latch circuit of FIG. 7. The transfer characteristic for the half latch circuit 744 of FIG. 7 is similar to the transfer characteristic for the CMOS inverter 536 of FIG. 5. As the input is swept from a low input logic value to a high input logic value, the output moves from the high output logic value to the low output logic value.

The latch 638 of FIG. 6, similar to the storage circuits 109, 209, and 309 of FIGS. 1, 2 and 3 respectively, comprises a pair of cross-coupled inverters 640 and 642 that provide positive feedback such that the circuit 638 is not easily analyzed with normal circuit analysis. Rather, referring to both FIG. 6 and FIG. 9, such a circuit 638 is analyzed graphically using stability curves 954 to describe the margin of failure. Margin of failure is a general term used to describe the stability of a circuit, and includes concepts such as signal noise margin with respect to logic circuits, and static and write noise margin for memory cells. Signal noise margin is applicable to any logic circuitry such as periphery circuits. Static noise margin is a term used in conjunction with reading a memory cell or latch. Write noise margin is a term used in conjunction with writing to a memory cell or latch since data is being written and stored in the cell. The stability curves 954 comprise two curves 955 and 957 that represent the transfer characteristic for each of the inverters 640 and 642 that comprise the latch 638, i.e. the transfer characteristic for that latch 638 as viewed from both sides of the latch 638. The solid stability lines 955 and 957 show a bistable latch, i.e. a circuit with two stable points such that a logic value at one node will reinforce the logic value at another logic node. The stable points 956 and 958 are identified at the points where the transfer curves 955 and 957 intersect. FIG. 9 also indicates that there is a third intersection near the midpoint of the transfer curves that provide metastable point 960. A dotted line 962 illustrates a stability failure that may incur due to a process variation in one of the inverters 640 or 642 such that they have different transfer characteristics. The dotted line 962 in this failure scenario intersects the second transfer curve 957 only in one place 964, and as such, is said to be monostable.

Figure 10:
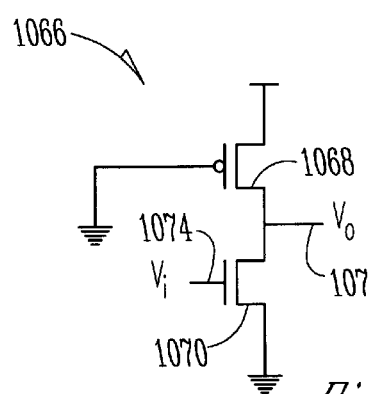

FIG. 10 illustrates a half latch circuit 1066 of a LL4TCMOS SRAM cell 300, shown in FIG. 3, to which data is being written to or from which data is being read. The circuit 1066 comprises an active PMOS access transistor 1068 and an NMOS pull-down transistor 1070. The circuit 1066 forms an inverter, as the logic value on the output line 1072 is the inverted logic of the logic value on the input line 1074. As previously described, the SRAM cell can be viewed as two half latch circuits connected as cross-coupled inverters.

Figure 11A:
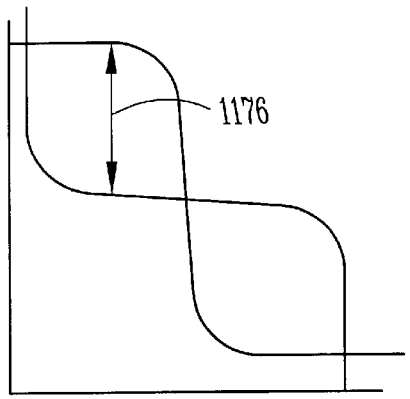
FIG. 11A illustrates a stability margin in the context of a write noise margin for the half latch of a SRAM cell as illustrated in FIG. 10, wherein the NMOS pull-down transistor has a low threshold voltage $V_{TN}$.
Figure 11B:
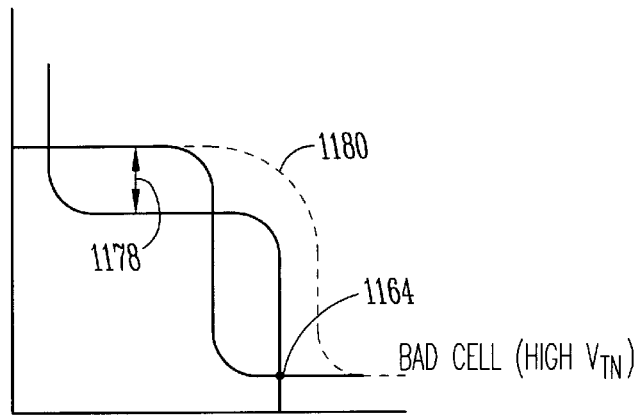
FIG. 11B illustrates stability margin in the context of a write noise margin for the half latch of a SRAM cell as illustrated in FIG. 10, wherein the NMOS pull-down transistor has a high threshold voltage $V_{TN}$, and further illustrates by means of a dotted line a situation in which a SRAM cell becomes monostable, loses its write noise margin and fails.

FIGS. 11A and 11B illustrate stability margins, or write noise margins, for a SRAM cell as it relates to the pull-down voltage $V_{TN}$ for the half latch circuit 1066 of FIG. 10. An unacceptably low write noise margin can result in an unstable pull-down transistor 1170 has a low threshold voltage $V_{TN}$, the SRAM cell has a large write noise margin 1176 and possesses the desirable characteristics of stability from accidental writes. However, as illustrated in FIG. 11B, if the NMOS pull-down transistor 1070 has a high threshold voltage $V_{TN}$, the SRAM cell has a lower write noise margin 1178 and possesses less stability from accidental writes. FIG. 11B also illustrates, by way of a dotted line, a situation in which the write noise margin 1180 is unacceptably low such as that which may occur if the threshold voltage $V_{TN}$ of the NMOS pull-down transistor 1070 is too high. This may occur due to process variations. The stability curves 1154 for an unacceptably low write noise margin only intersect in one position 1164 and as such is monostable as mentioned above in connection with FIG. 9. A monostable cell, by definition, is a failure since only one logic state exists for the cell. However, as will be described with respect to FIGS. 12A and 12B, there are circumstances in which a larger threshold voltage $V_{TN}$ is desired to reduce leakage current.

Figure 12A:
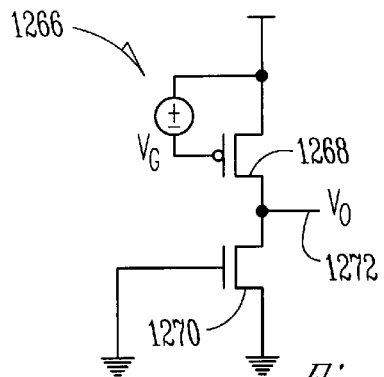
FIG. 12A illustrates a half latch of a LL4TCMOS SRAM cell in which data is being retained.
Figure 12B:
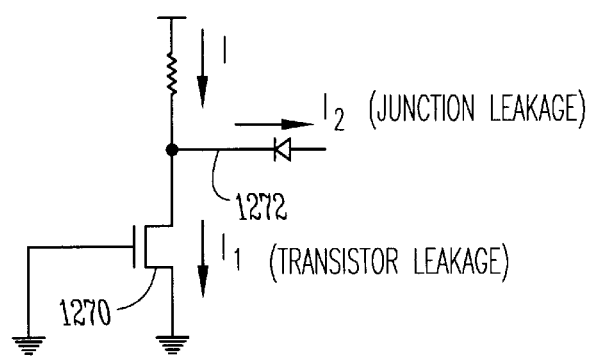
FIG. 12B illustrates the leakage paths for the half latch of FIG. 12A.

FIG. 12A illustrates a half latch 1266 in an LL4TCMOS SRAM cell in which data is being retained, and will be described in conjunction with FIG. 12B to illustrate leakage current. In the data retention state, the circuit 1266 comprises an inactive PMOS access transistor 1268 with its gate pulled high and an inactive NMOS pull-down transistor 1270 with its gate pulled low. A high logic voltage is stored on the output line 1272. FIG. 12B illustrates the leakage current paths for the half latch 1266 of FIG. 12A. The leakage current for the SRAM cell comprises two components. Referring to both FIGS. 3 and 12B, the first leakage current component $I_1$ is the subthreshold transistor leakage current through one of the NMOS pull-down transistors in the LL4TCMOS SRAM cell 300 such as transistor 310, for example. The second leakage current component $I_2$ is the reverse-biased junction leakage current from the drain node of one of the NMOS transistors such as transistor 310, for example. FIG. 12B also indicates the subthreshold current I that is required to be sourced through the PMOS access transistors 322 and 324 of FIG. 3 or 1268 of FIG. 12A of the LL4TCMOS SRAM cell to offset the leakage current $I_1$ and $I_2$, and prevent the SRAM cell 300 from changing state. The subthreshold leakage current I increases significantly as the temperature rises. For example, the subthreshold $V_T$ may increase 1.3 mV per degree C.

Figure 13A:
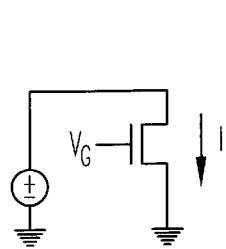
FIG. 13A illustrates a pull-down transistor in a LL4TCMOS SRAM cell.
Figure 13B:
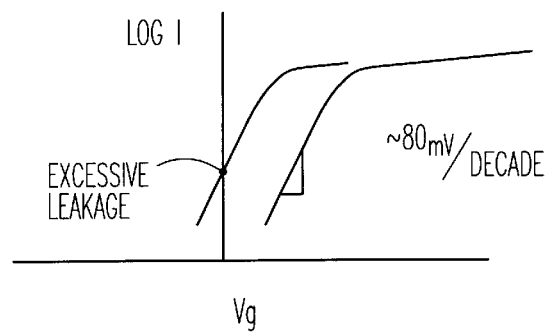
FIG. 13B illustrates the relationship between the log of the subthreshold current I and the gate voltage $V_G$ for the circuit of FIG. 13A.

As illustrated by the logarithmic graph of FIG. 13, the relation between the gate voltage $V_G$ and the subthreshold current I that results can be approximately 80 mV per decade. The precise relationship is a function of process. The subthreshold $V_T$ is a function of temperature ($\approx$1.3 mV per ° C.). If, for example, the temperature changes 61° C. (1.3 mV per ° C.*61° C.=80 mV), then the undesired leakage current $I_1$ increases by 10x, or a decade. This undesired leakage current provides data retention problems.

Figure 14:
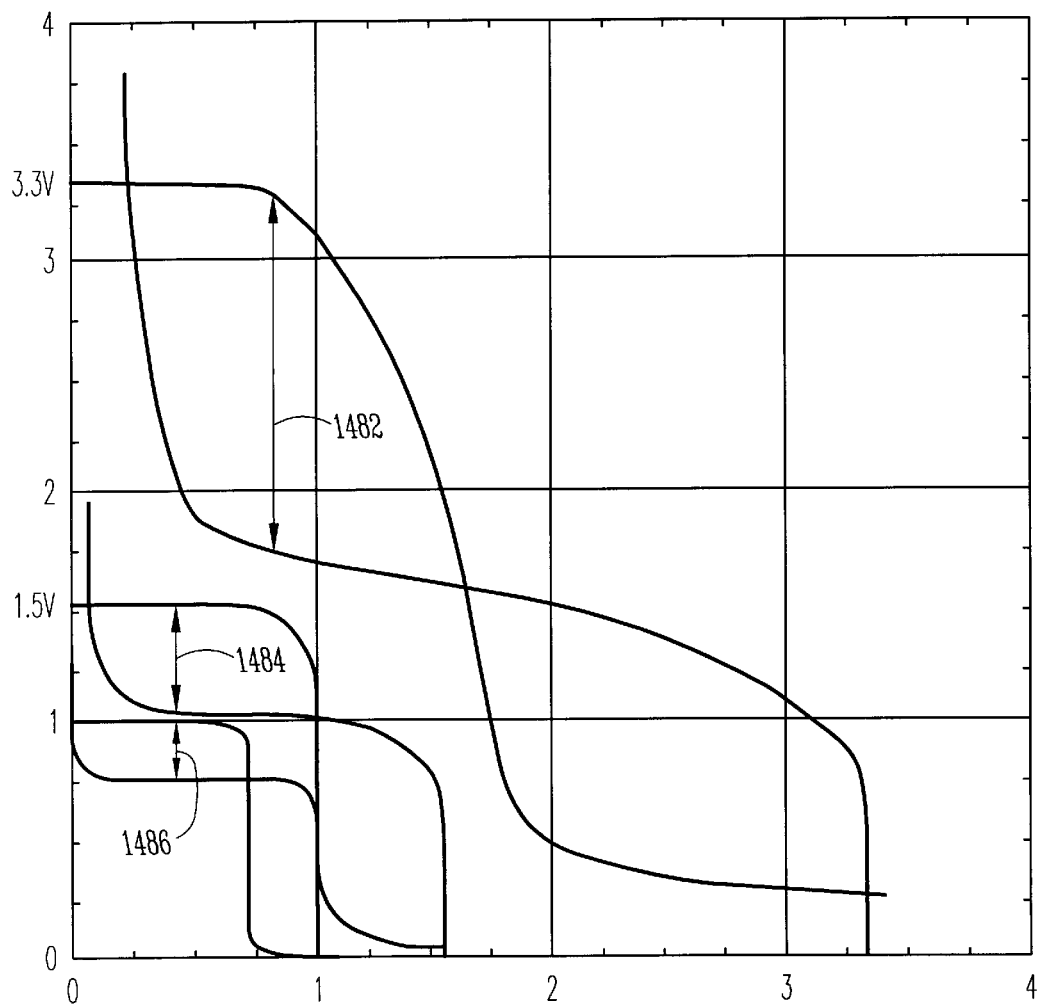
FIG. 14 illustrates stability margins, and particularly write noise margins for a SRAM cell at 3.3 volts, 1.5 volts and 1.0 volts.

FIG. 14 illustrates static noise margins or write noise margins for a SRAM circuit at three voltage levels: 3.3V, 1.5V and 1.0V. FIG. 14 further illustrates that the write noise margin decreases as the voltage levels decrease. In the example shown, the write noise margin 1482 for the SRAM circuit at 3.3 volts is on the order of about 1.25V to 1.50V, the write noise margin 1484 for the SRAM circuit at 1.5V is on the order of about 0.40V to 0.50V, and the write noise margin 1486 for the SRAM circuit at 1V is on the order of 200 mV. It is evident that write noise margin becomes tighter and more of a concern as voltage scaling occurs. A SRAM circuit will have problems with accidental writes if it is operating at 1V with a write noise margin of 200 mV. When one of the bit lines of a SRAM array is driven low during a write to a SRAM cell, the voltage of an adjacent bit line will be induced lower to some degree due to capacitive coupling between the two adjacent lines. The coupling exists to some degree even if the bit lines are designed to reduce coupling by twisting bit lines, for example. If voltage on the second line couples down from 1.0V to about 0.8V, there will be an accidental write to the SRAM cell associated with the second or adjacent bit line. Maintaining an appropriate write noise margin for the SRAM array that accounts for the various noise sources is necessary to prevent these accidental writes caused by capacitive coupling in adjacent bit lines.

Figure 15:
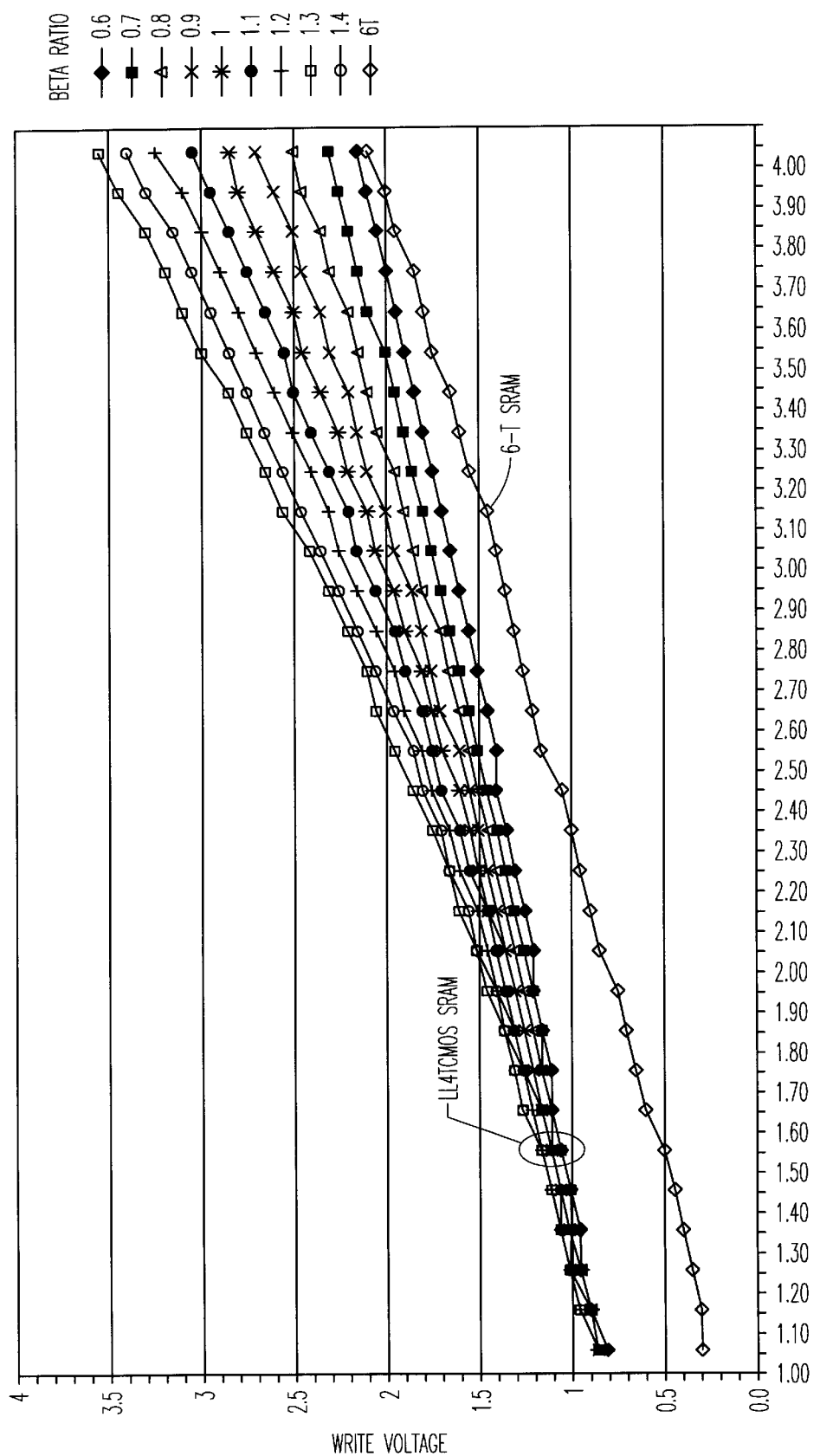
FIG. 15 is a graph of the write voltage plotted against Vcc for both a 6-T SRAM cell and for LL4TCMOS SRAM cells of varying Beta ratios.

FIG. 15 is a graph of the write voltage plotted against the power $V_{CC}$ for both a 6-T SRAM cell 200 as illustrated in FIG. 2 and an LL4TCMOS SRAM cell 300 as illustrated in FIG. 3. Simulations were performed and plots were made for LL4TCMOS SRAM cells having different Beta ratios, which is the ratio of the Beta of the PMOS access transistor 322/324 to the Beta of the corresponding NMOS pull-down transistor 310/312. Again, the Beta ratio implies an impedance ratio for the PMOS access transistor 322/324 and the NMOS pull-down transistor 310/312 that controls the voltage drop across the PMOS access transistor 322/324, and thus the write voltage across the NMOS pull-down transistor 310/312. FIG. 15 shows that the LL4TCMOS SRAM cell 300 requires a larger write voltage than the 6-T SRAM cell 200 for the same $V_{CC}$. This difference in the required write voltage with respect to a $V_{CC}$ is attributable to the fundamental differences in operation between the two cell types.

Figure 16A:
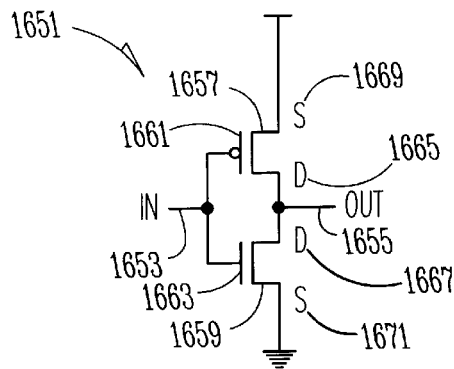
FIG. 16A illustrates a schematic for a CMOS inverter.
Figure 16B:
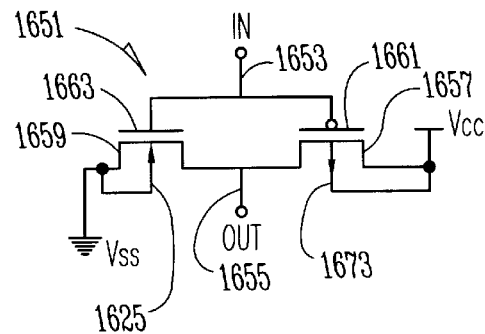
FIG. 16B illustrates another schematic for a CMOS inverter, including a body terminal for the transistors of the CMOS inverter.
Figure 16C:
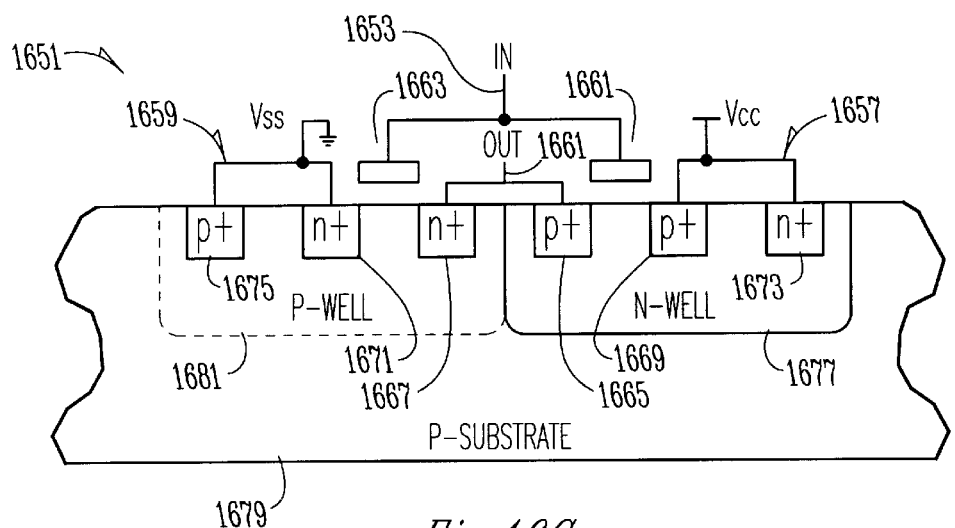
FIG. 16C illustrates a cross section of the CMOS inverter of FIG. 16B in an n-well process.

FIGS. 16A, 16B, and 16C are schematics for a CMOS inverter, and a cross section of the CMOS inverter in an n-well process. According to the present invention, the NMOS pull-down transistors within the LL4TCMOS SRAM cell are fabricated as a triple-well transistor. A triple-well transistor is described below by first describing a common CMOS inverter 1651 for a point of reference, as illustrated in FIGS. 16A, 16B and 16C, and then describing the fabrication of the triple-well transistor. FIG. 16A illustrates a simple schematic for a CMOS inverter 1651, which has an input terminal 1653 and an output terminal 1655, and includes a PMOS transistor 1657 and an NMOS transistor 1659. The input terminal 1653 is tied to the gates 1661 and 1663 of both transistors 1657 and 1659. The drain 1665 of the PMOS transistor 1661 is coupled to the drain 1667 of the NMOS transistor 1663 to form the output terminal 1655. The source 1669 of the PMOS transistor 1661 is coupled to $V_{CC}$ and the source 1671 of the NMOS transistor 1663 is coupled to $V_{SS}$.

The schematic of FIG. 16B is essentially the schematic of FIG. 16A, except that it includes representations for the body terminals 1673 and 1675 for both the PMOS transistor 1657 and the NMOS transistor 1659, and has been rotated ninety degrees to the right to make an easier comparison between FIGS. 16B and 16C. FIG. 16C illustrates a cross section of the CMOS inverter 1651 in an n-well process. An n-well 1677 is formed in the p-substrate 1679. The NMOS transistor 1659 is formed in a p-well region 1681 of the p-substrate 1679, and the PMOS transistor 1657 is formed in the n-well 1677. The source 1669 and drain 1665 of the PMOS transistor 1657 are formed by the p+ contacts and the source 1671 and drain 1667 of the NMOS transistor 1659 are formed by the n+ contacts. The p-well 1681/p-substrate 1679 is coupled to $V_{SS}$ through a p+ contact which forms the body terminal 1675 of the NMOS transistor 1659, and the n-well 1677 is coupled to $V_{CC}$ through an n+ contact which forms the body terminal 1673 of the PMOS transistor 1657. As illustrated in FIGS. 16B and 16C, the body terminal 1673 and 1675 of the transistors 1657 and 1659 is often connected to the respective source 1669 and 1671.

Figure 17:
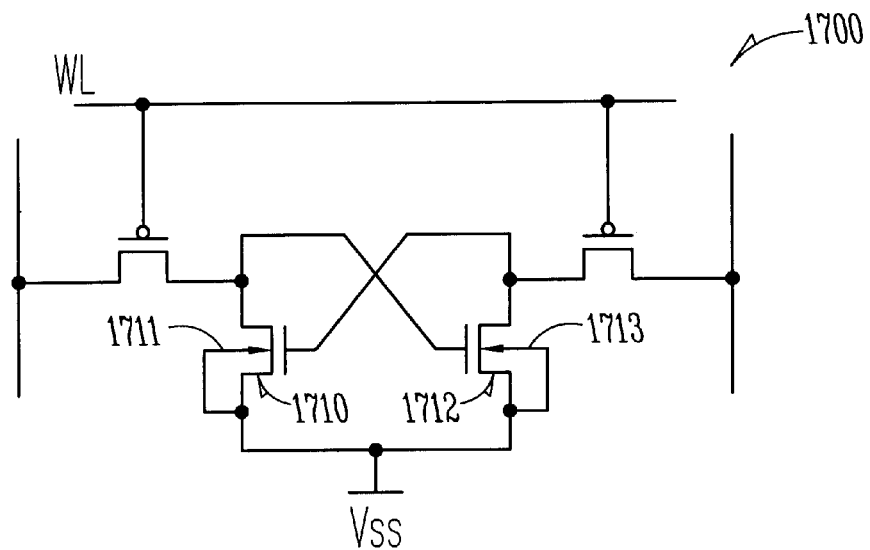
FIG. 17 illustrates the LL4TCMOS SRAM cell of FIG. 3 with the body terminals for the NMOS pull-down transistors connected to the substrate.

Having described a common CMOS inverter to provide a point of reference, a SRAM cell with triple-well pull-down transistors will now be described. FIG. 17 shows the conventional LL4TCMOS SRAM cell 1700, previously shown in FIG. 3, and illustrates that the body terminals 1711 and 1713 for the NMOS pull-down transistors 1710 and 1712 are conventionally connected to the substrate $V_{SS}$.

Figure 18:
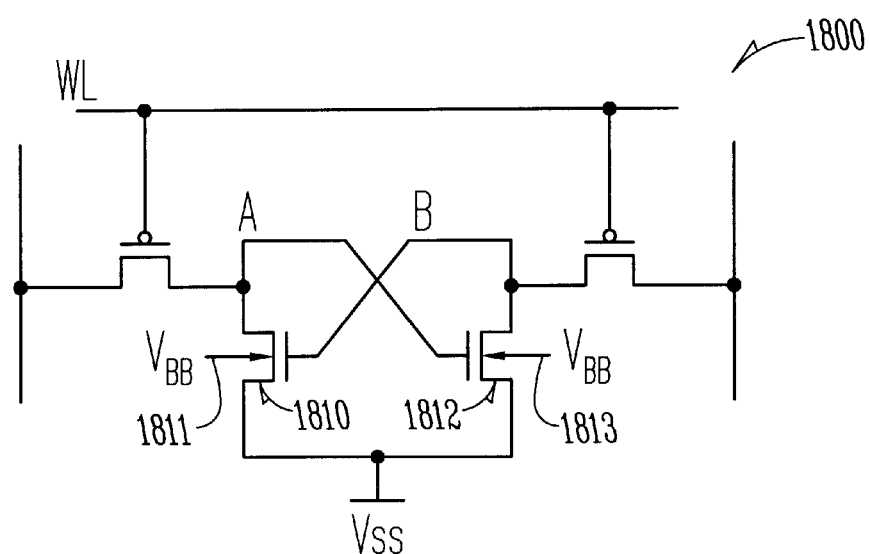
FIG. 18 illustrates the LL4TCMOS SRAM cell with the body terminals connected to $V_{BB}$ and electrically isolated with respect to the substrate.

FIG. 18 illustrates the LL4TCMOS SRAM cell 1800 according to the present invention, and shows that the body terminals 1811 and 1813 of the NMOS pull-down transistors 1810 and 1812 are electrically isolated with respect to the substrate $V_{SS}$ and are connected to a body bias voltage $V_{BB}$.

Figure 19:
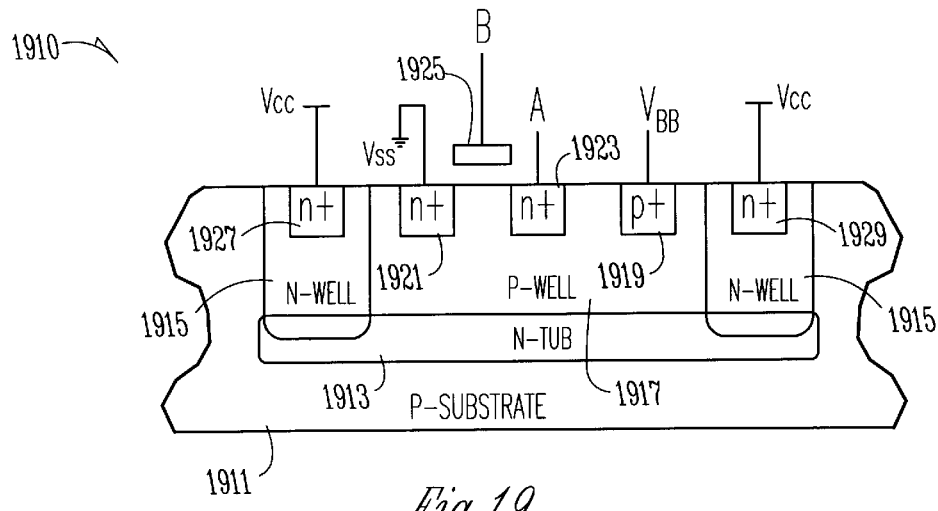
FIG. 19 illustrates a cross section of an NMOS pull-down transistor formed by a triple-well or n-tub process.

FIG. 19 illustrates a cross section of an NMOS transistor 1910 formed by a triple-well or n-tub process such as that which may form one or more of the NMOS pull-down transistors 1810 or 1812 for the LL4TCMOS SRAM cell of FIG. 18. The starting material is a p-substrate 1911, and a n-tub region 1913 is formed in the p-substrate 1911. A pair of n-wells 1915 extend from the n-tub 1913 such that the n-wells 1915 and the n-tub 1913 form boundaries for a p-well region 1917 such that it is electrically isolated from the p-substrate 1911. The n-well regions 1915 and the n-tub region 1913 are electrically coupled to each other. Each n-well 1915 has a $V_{CC}$ n+ contact 1927 and 1929. An insulator material (not shown) is formed over the p-well 1917. P-well 1917 forms the body region of the transistor 1910. A $V_{BB}$ p+ contact 1919 is formed in the p-well region 1917, which forms the body terminal shown as 1811 for the NMOS triple-well transistor 1810 in FIG. 18. The NMOS pull-down transistor 1910 is formed in the p-well 1917. The source and drain of the NMOS transistor 1910 are formed by the n+ contacts 1921 and 1923 that are formed in the p-well 1917, and a gate 1925 is formed in an operable relation thereto. The illustrated triple-well transistor of FIG. 19 is a six-terminal transistor, and is shown with the appropriate contacts to form the NMOS pull-down transistor 1810 of FIG. 18. As described above, the two n-well terminals are connected to $V_{CC}$, one p-well or body terminal is connected to $V_{BB}$, the drain terminal is connected to node A, the gate terminal is connected to node B, and the source terminal is connected to $V_{SS}$.

The body region is isolated by the n-well region 1915, which may have an annular shape, and by the n-tub region 1913. FIG. 19 illustrates one example in which the n-well is connected to $V_{CC}$. However, the n-tub may be connected to $V_{SS}$ or to another voltage, and still provide an isolated body region 1917.

Isolating the body region 1917 using the above-described triple-well process allows the threshold voltage $V_T$ to be controlled by controlling $V_{BB}$. The threshold voltage $V_T$ is a function of a number of parameters. For example, the threshold voltage $V_T$ varies with respect to the voltage difference between the substrate and the source of the MOS transistor. This is known as the body effect. The following equation shows the effects that some of these parameters have on the threshold voltage.

$$V_T = V_{T0} + \gamma[\sqrt{(2\phi_b + |V_{sb}|)} - \sqrt{(2\phi_b)}]$$

$V_{sb}$ is the substrate bias, $V_{T0}$ is the threshold voltage for $V_{sb}=0$, $\gamma$ is a constant, and $\phi_b$ is the bulk potential which accounts for the doping of the substrate. The equation provided above shows that the threshold voltage $V_T$ is dependent on the substrate bias $V_{SB}$. By isolating the p-well 1917, a separate body bias voltage $V_{BB}$ can be applied to the p-well 1917, and thus be substituted for $V_{SB}$ in the equation provided above. Thus, it is noted that the body bias voltage $V_{BB}$ can be adjusted to adjust $V_T$, and that a temperature-compensated body bias voltage $V_{BB}$ can be used to provide a temperature-compensated pull-down $V_T$.

According to one embodiment, the temperature-compensated bias voltage is provided by comparing the threshold voltage $V_T$ or a $V_T$-dependent voltage, and a reference voltage such as a temperature independent reference voltage ($V_{TEMP-I}$). It is noted that a desired comparison between the threshold voltage $V_{TN}$ and the temperature-independent reference voltage $V_{TEMP-I}$ may require an offset voltage or a multiplier. Additionally, it is noted some temperature dependence may be desired or required in the current or voltage. Circuits designed with such temperature dependence are referred to herein as circuits with reduced temperature-dependence with positive or negative slope (RTDWPNS circuits). The temperature dependence can be changed using laser trimmable devices, fuses, antifuses and/or transistors.

According to one embodiment, the sum of a temperature-independent voltage drop ($V_{STACK}$) and the threshold voltage $V_{TN}$ of the array provides a $V_T$-dependent voltage ($V_{TEMP-D}$) of sufficient magnitude for comparison to the temperature-independent reference voltage $V_{TEMP-I}$. According to another embodiment, a reference voltage is divided using appropriate devices that have appropriate temperature coefficients to provide a temperature-independent reference voltage ($V_{TEMP-I}$) of an appropriate magnitude for comparison to the threshold voltage $V_{TN}$ of the array. These two embodiments are illustrated in FIGS. 20A and 20B, respectively, and in FIGS. 21A and 21B, respectively.

The description provided below with respect to FIGS. 20A–B and 21A–F refers to pull-down transistors. The term pull-down transistor or pull-down transistor array is not intended to represent or infer a particular process or transistor layout.

Figure 20A:
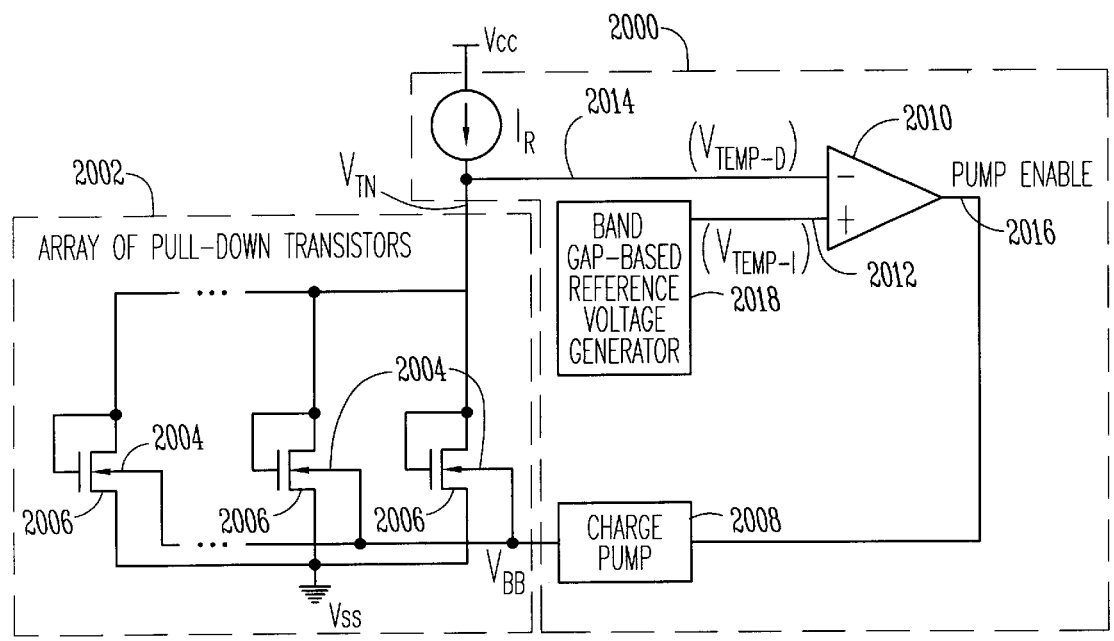
FIG. 20A illustrates a block diagram for one embodiment of a transistor body bias generator coupled to an array of pull-down transistors within a SRAM array.

FIG. 20A illustrates a block diagram for one embodiment of a transistor body bias generator 2000, according to the teachings of the present invention, coupled to an array 2002 of pull-down transistors within a SRAM array. The bias generator 2000 is adapted for generating a temperature-compensated bias voltage $V_{BB}$ for the body terminals 2004 of the transistors 2006 to provide the pull-down transistor bank 2002 with a temperature-compensated pull-down $V_T$. The generator 2000 comprises a charge pump 2008 coupled to the body terminals 2004 of the transistors 2006 within the array of pull-down transistors 2002. The generator also includes a comparator 2010 coupled to the charge pump 2008. The comparator 2010 has a first input terminal 2012, a second input terminal 2014, and an output terminal 2016. A temperature-independent reference voltage ($V_{TEMP-I}$) from a bandgap generator 2018 is received at the first input 2012, and a $V_T$-dependent voltage ($V_{TEMP-D}$) from the array 2002 of pull-down transistors is received at the second input 2014. The output 2016 of the comparator 2010 presents a control signal Pump Enable to the charge pump 2008 such that the charge pump 2008 charges the body terminals 2004 of the transistors 2006 in the array 2002 when the $V_T$-dependent voltage $V_{TEMP-D}$ has dropped with respect to or is lower than the temperature-independent reference voltage $V_{TEMP-I}$.

FIG. 20B illustrates a block diagram for another embodiment of a transistor body bias generator 2000, according to the teachings of the present invention, coupled to an array 2002 of pull-down transistors within a SRAM array. The bias generator 2000 is adapted for generating a temperature-compensated bias voltage $V_{BB}$ for the body terminals 2004 of the transistors 2006 to provide the pull-down transistor bank 2002 with a temperature-compensated pull-down $V_T$. The generator 2000 comprises a charge pump 2008 coupled to the body terminals 2004 of the transistors 2006 within the array of pull-down transistors 2002. The generator also includes a comparator 2010 coupled to the charge pump 2008. The comparator 2010 has a first input terminal 2012, a second input terminal 2014, and an output terminal 2016. A temperature-independent reference voltage ($V_{TEMP-I}$) from a bandgap generator 2018 is received by a fractional multiplier 2019 at 2013. The fractional multiplier 2019 applies a multiplication factor A to the temperature-independent reference voltage $V_{TEMP-I}$ to provide the temperature-independent voltage $AV_{TEMP-I}$ to the first input 2012 of the comparator 2010. A $V_T$-dependent voltage ($V_{TEMP-D}$) from the array 2002 of pull-down transistors is received at the second input 2014 of the comparator 2010. The output 2016 of the comparator 2010 presents a control signal Pump Enable to the charge pump 2008 such that the charge pump 2008 charges the body terminals 2004 of the transistors 2006 in the array 2002 when the $V_T$-dependent voltage $V_{TEMP-D}$ has dropped with respect to or is lower than the temperature-independent reference voltage $V_{TEMP-I}$.

FIGS. 20C, 20D, 20E and 20F illustrate biasing arrangements for a pull-down transistor. FIG. 20C illustrates one biasing arrangement for a pull-down transistor 2006 that is similar to that shown in the array of pull-down transistors in FIGS. 20A and 20B. According to this embodiment, the array of pull-down transistors includes a plurality of diode-connected transistors 2006 connected in parallel. The body terminal 2004 of the transistor 2006 is connected to the charge pump.

FIG. 20D illustrates another biasing arrangement for a pull-down transistor. According to this embodiment, the array of pull-down transistors includes a plurality of diode-connected transistors 2006 connected in parallel. The body terminal 2004 of the transistor 2006 is connected to the source 2005 such that both the body terminal 2004 and the source 2005 are connected to the charge pump.

FIG. 20E illustrates another biasing arrangement for a pull-down transistor. According to this embodiment, the array of pull-down transistors includes a plurality of diode-connected transistor stacks 2007 connected in parallel. According to one embodiment, each transistor stack 2007 includes a first diode-connected transistor 2006a stacked on a second diode-connected transistor 2006b as illustrated. The body terminal 2004a of the first transistor 2006a is connected to the body terminal 2004b of the second transistor 2006b such that both body terminals 2004a and 2004b are connected to the charge pump.

FIG. 20F illustrates another biasing arrangement for a pull-down transistor. According to this embodiment, the array of pull-down transistors includes a plurality of diode-connected transistor stacks 2007 connected in parallel. According to one embodiment, each transistor stack 2007 includes a first diode-connected transistor 2006a stacked on a second diode-connected transistor 2006b as illustrated. The body terminal 2004a of the first transistor 2006a is connected to the body terminal 2004b of the second transistor 2006b, and the body terminal 2004b of the second transistor 2006b is connected to the source 2005 of the second transistor 2006b. Thus, the body terminals 2004a and 2004b and the source 2005 of the second transistor 2006b are connected to the charge pump.

Figure 21A:
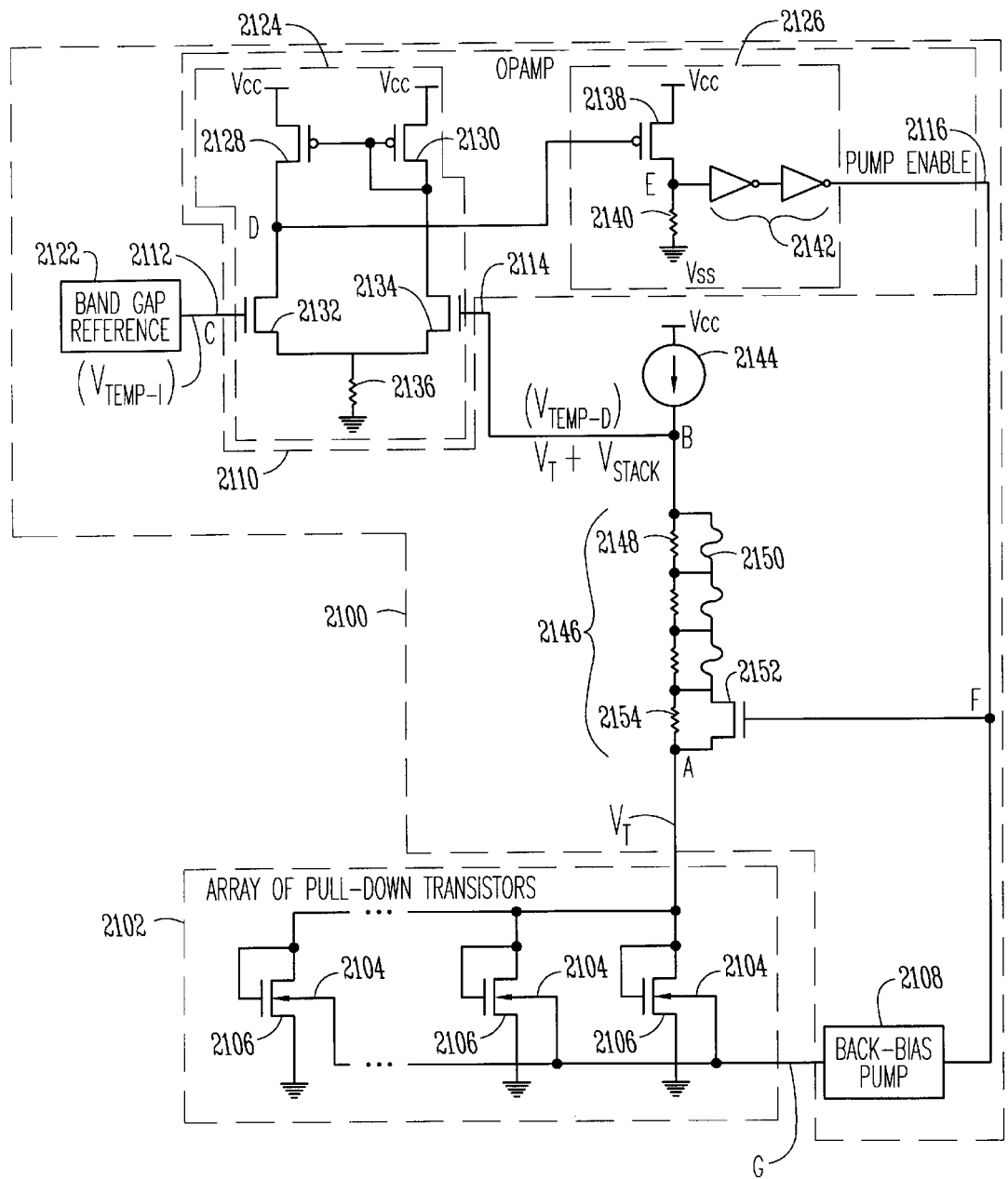
FIG. 21A illustrates a block diagram for one embodiment of a transistor body bias generator coupled to an array of pull-down transistors within a SRAM array.

FIG. 21A illustrates a block diagram for one embodiment of a transistor body bias generator coupled to an array of pull-down transistors within a SRAM array. The pull-down transistors 2106 have a threshold voltage $V_T$ that provide the array 2102 with an overall threshold voltage $V_T$. The bias generator 2100 comprises a charge pump or back bias pump 2108, a current source 2144, stack of resistors 2146, comparator 2110, and band gap reference 2122. The charge pump 2108 is coupled to the body terminals 2104 of the transistors 2106 in the array 2102.

The comparator 2110 is coupled to the charge pump 2108. The first input 2112 receives a temperature-independent reference voltage $V_{TEMP-I}$ from a bandgap reference generator 2122. A second input 2114 receives a $V_T$-dependent voltage $V_{TEMP-D}$ from the array 2102 of pull-down transistors, the current source 2144, and the stack of resistors 2146. An output 2116 of the comparator 2110 presents a control signal Pump Enable to the charge pump 2108. The charge pump 2108 selectively biases the body terminal 2104 of the transistors 2106 in the array 2102 with the temperature-compensated $V_{BB}$ to maintain a temperature-independent threshold voltage $V_T$.

One embodiment of the comparator 2110 includes an operational amplifier, including a differential amplifier 2124 and an output stage 2126. The differential amplifier 2124 comprises a pair of PMOS transistors 2128 and 2130 coupled to $V_{CC}$ in a current mirror configuration. The differential amplifier 2124 further comprises a pair of NMOS transistors 2132 and 2134, each of which are coupled between one of the PMOS transistors 2128 and 2130 and a pull-down resistor 2136. The gate of the first NMOS transistor 2132 is connected to the bandgap reference generator 2122 and thus receives the temperature-independent voltage at node C or input 2112. The gate of the second NMOS transistor 2134 receives the $V_T$-dependent voltage $V_{TEMP-D}$ at node B or input 2114. In one embodiment, the output stage 2126 of the comparator 2110 comprises a PMOS pull-up transistor 2138, a pull-down resistor 2140 and a buffer amplifier 2142 coupled together at node E. The illustrated buffer amplifier 2142 includes a pair of inverters. The gate of the PMOS transistor 2138 is coupled to, and thus is controlled by, node D of the differential amplifier 2124.

The operation of the comparator 2110 and charge pump 2108 is as follows. As the temperature increases, the threshold voltage $V_T$ at node A and the $V_T$-dependent voltage $V_{TEMP-D}$ at node B will decrease with respect to the temperature-independent reference voltage $V_{TEMP-I}$ at node C. As one of ordinary skill in the art will understand upon reading this disclosure, the circuit configuration provides a drop in the voltage at node D. The lower voltage at node D causes the PMOS transistor 2138 to pull up the voltage at node E, which produces the Pump Enable signal at node F. The Pump Enable signal controls the charge pump 2108, and causes the pump 2108 to provide a more negative voltage back bias ($V_{BB}$). The more negative $V_{BB}$ raises the threshold voltage $V_{TN}$ of the NMOS pull-down transistors 2106, and thus raises the voltage at node B. Again, due to the circuit configuration, the increased voltage at node B raises the voltage at node D, lowers the voltage at node E, and turns off the Pump Enable signal. In other words, the circuit of the present invention self corrects or self adjusts for fluctuations or variations in the temperature.

As shown in FIG. 21A, the current source 2144, stack of resistors 2146, comparator 2110, and band gap reference 2122 include a current source 2144 coupled to a resistor stack 2146. The current source 2144 has a current source temperature coefficient and the resistor stack 2146 has a resistor stack temperature coefficient. Such current sources are known by those of ordinary skill in the art. The current source temperature coefficient and the resistor stack temperature coefficient are inversely proportional such that the current source 2144 and the resistor stack 2146 produce a temperature-independent voltage drop across the resistor stack $V_{STACK}$. The current source 2144 and resistor stack 2146 are coupled to the array 2102 such that the sum of $V_T$ and $V_{STACK}$ provide the $V_T$-dependent voltage $V_{TEMP-D}$ at node B, which is of sufficient magnitude for comparison to the temperature-independent reference voltage or bandgap reference voltage at node C.

The combination of the current source 2144 and stack of resistors 2146 may contain laser trimmable devices, fuses, antifuses and/or transistors which allow manipulation of the $V_T$-dependent voltage at node B. In the illustrated example, the resistor stack 2146 includes a plurality of resistors 2148 coupled in series between the array 2102 and the comparator 2110, and further includes at least one fuse 2150 connected in parallel across at least one of the resistors 2148. The resistor stack 2146 illustrated in FIG. 21A shows one fuse 2150 connected in parallel with each resistor 2148. In one embodiment, an unblown fuse provides a short across the resistor. Blowing one of the fuses, however, increases $V_{STACK}$ and thus the $V_T$-dependent voltage $V_{TEMP-D}$ at node B. As one skilled in the art would understand, other embodiments include laser trimmable devices, anti-fuses and/or transistors to adjust $V_{STACK}$.

Figure 22A:
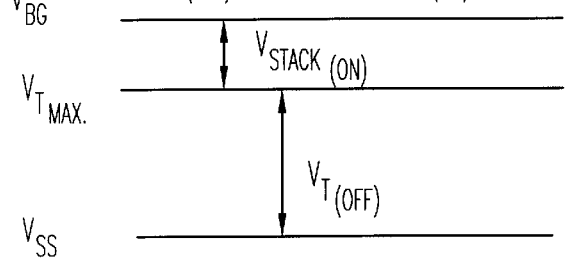
FIGS. 22A and 22B illustrate the hysteresis effect that the shunt transistor of FIG. 21A has on the operation of the charge pump, wherein a lower $V_T$ turns the charge pump on and a higher $V_T$ turns the charge pump off.
Figure 22B:
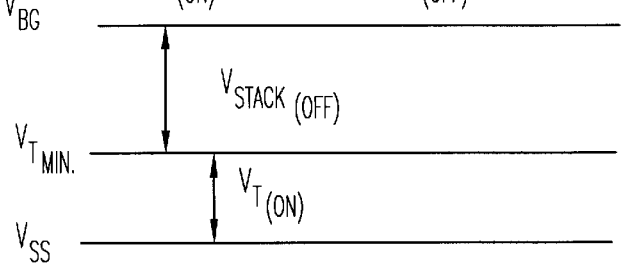
Figure 23:
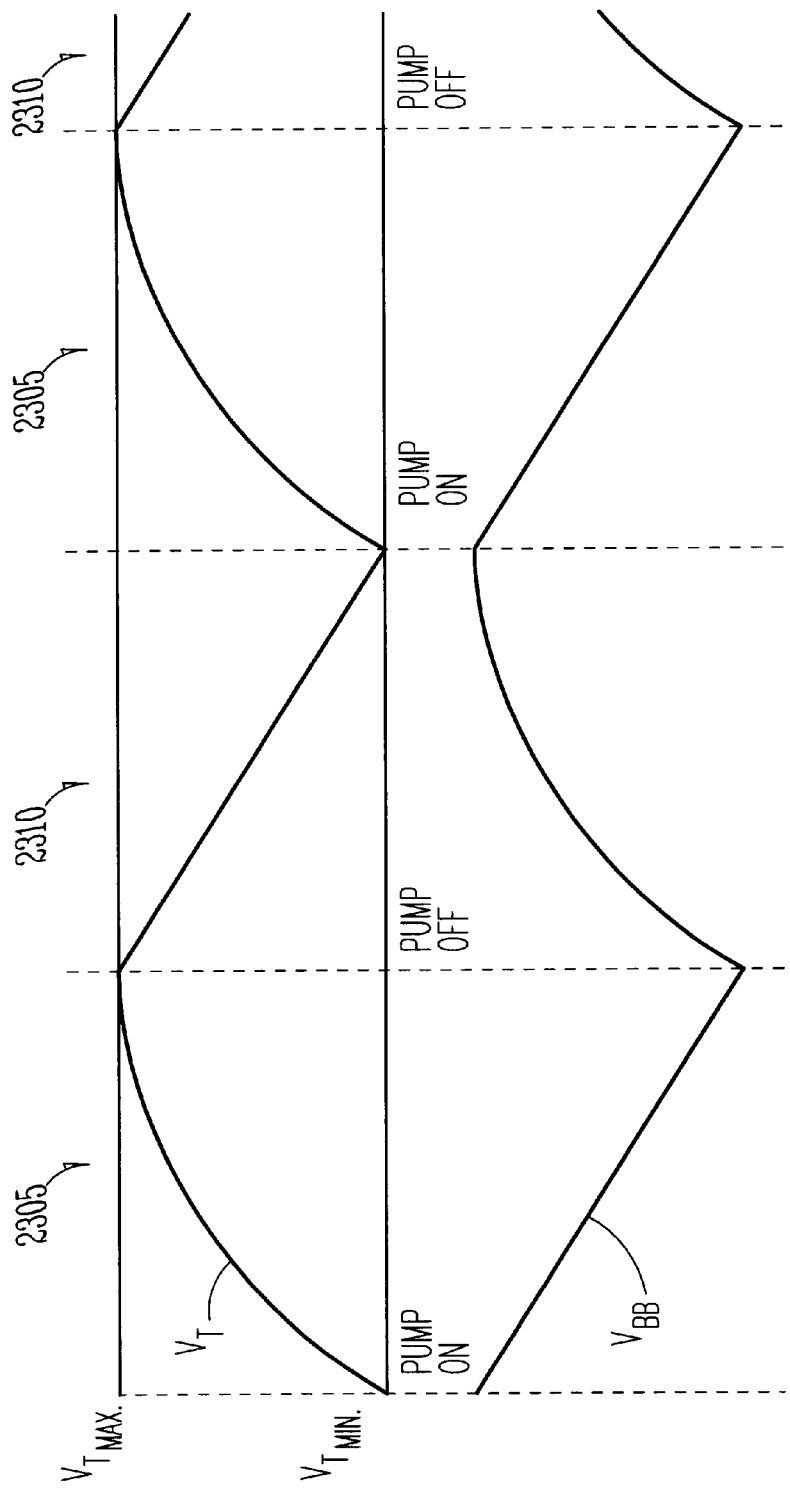
FIG. 23 illustrates the hysteresis effect that the shunt transistor of FIG. 21A has on the operation of the charge pump, wherein the operation state of the charge pump is provided for a $V_T$ that is oscillating between a $V_{Tmax}$ and a $V_{Tmin}$.

FIG. 21A also illustrates a shunt transistor 2152 connected across at least one resistor 2154. The gate of the shunt transistor 2152 is coupled to the output 2116 of the comparator 2110, and thus receives the control signal from the comparator 2110. The control signal activates the shunt transistor 2152 to shunt the resistor(s) and provide a hysteresis effect, as illustrated in FIGS. 22A, 22B and 23 and described below. Thus, there is a larger voltage drop across the resistor stack when the control signal is off ($V_{STACK\,(OFF)}$) than when the control signal is on ($V_{STACK(ON)}$).

Figure 21B:
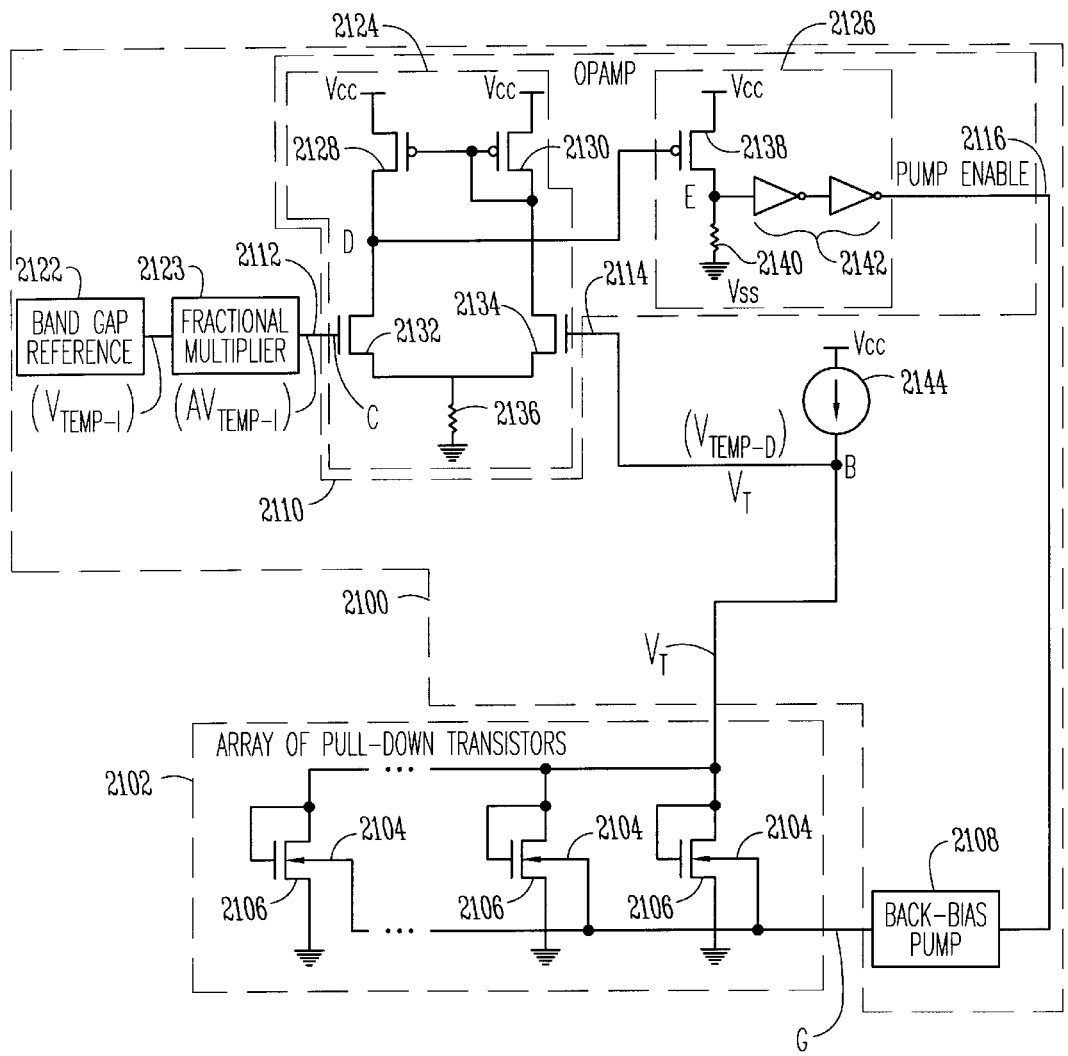
FIG. 21B illustrates a block diagram for another embodiment of a transistor body bias generator coupled to an array of pull-down transistors within a SRAM array.

FIG. 21B illustrates a block diagram for another embodiment of a transistor body bias generator coupled to an array of pull-down transistors within a SRAM array. The pull-down transistors 2106 have a threshold voltage $V_T$ that provide the array 2102 with an overall threshold voltage $V_T$. The bias generator 2100 comprises a charge pump or back bias pump 2108, a current source 2144, a comparator 2110, band gap reference 2122, and fractional multiplier 2123. The charge pump 2108 is coupled to the body terminals 2104 of the transistors 2106 in the array 2102.

The comparator 2110 is coupled to the charge pump 2108. A bandgap reference generator 2122 provides a temperature-independent reference voltage ($V_{TEMP-I}$) to a fractional multiplier 2123. The fractional multiplier 2123 converts $V_{TEMP-I}$ into a fraction of the temperature-independent reference voltage ($AV_{TEMP-I}$). The first input 2112 of the comparator 2110 receives $AV_{TEMP-I}$. A second input 2114 receives a $V_T$-dependent voltage $V_{TEMP-D}$ from the array 2102 of pull-down transistors. An output 2116 of the comparator 2110 presents a control signal Pump Enable to the charge pump 2108. The charge pump 2108 selectively biases the body terminal 2104 of the transistors 2106 in the array 2102 with the temperature-compensated $V_{BB}$ to maintain a temperature-independent threshold voltage $V_T$ when the $V_T$-dependent voltage $V_{TEMP-D}$ is less than the temperature-independent voltage $V_{TEMP-I}$.

One embodiment of the comparator 2110 includes an operational amplifier, including a differential amplifier 2124 and an output stage 2126. The differential amplifier 2124 comprises a pair of PMOS transistors 2128 and 2130 coupled to $V_{CC}$ in a current mirror configuration. The differential amplifier 2124 further comprises a pair of NMOS transistors 2132 and 2134, each of which are coupled between one of the PMOS transistors 2128 and 2130 and a pull-down resistor 2136. The gate of the first NMOS transistor 2132 is connected to the bandgap reference generator 2122 and thus receives the temperature-independent voltage at node C or input 2112. The gate of the second NMOS transistor 2134 is connected to the bandgap current source 2144 and thus receives the $V_T$-dependent voltage $V_{TEMP-D}$ at node B or input 2114. In one embodiment, the output stage 2126 of the comparator 2110 comprises a PMOS pull-up transistor 2138, a pull-down resistor 2140 and a buffer amplifier 2142 coupled together at node E. The illustrated buffer amplifier 2142 includes a pair of inverters. The gate of the PMOS transistor 2138 is coupled to, and thus is controlled by, node D of the differential amplifier 2124.

The operation of the comparator 2110 and charge pump 2108 is as follows. As the temperature increases, the threshold voltage $V_T$ at node B will decrease with respect to the temperature-independent reference voltage $AV_{TEMP-I}$ at node C. As one of ordinary skill in the art will understand upon reading this disclosure, the circuit configuration provides a drop in the voltage at node D. The lower voltage at node D causes the PMOS transistor 2138 to pull up the voltage at node E, which produces the Pump Enable signal at node F. The Pump Enable signal controls the charge pump 2108, and causes the charge pump 2108 to provide a more negative voltage back bias ($V_{BB}$). The more negative $V_{BB}$ raises the threshold voltage $V_{TN}$ of the NMOS pull-down transistors 2106, and thus raises the voltage at node B. Again, due to the circuit configuration, the increased voltage at node B raises the voltage at node D, lowers the voltage at node E, and turns off the Pump Enable signal. In other words, the circuit of the present invention self corrects or self adjusts for fluctuations or variations in the temperature.

Figure 21C:
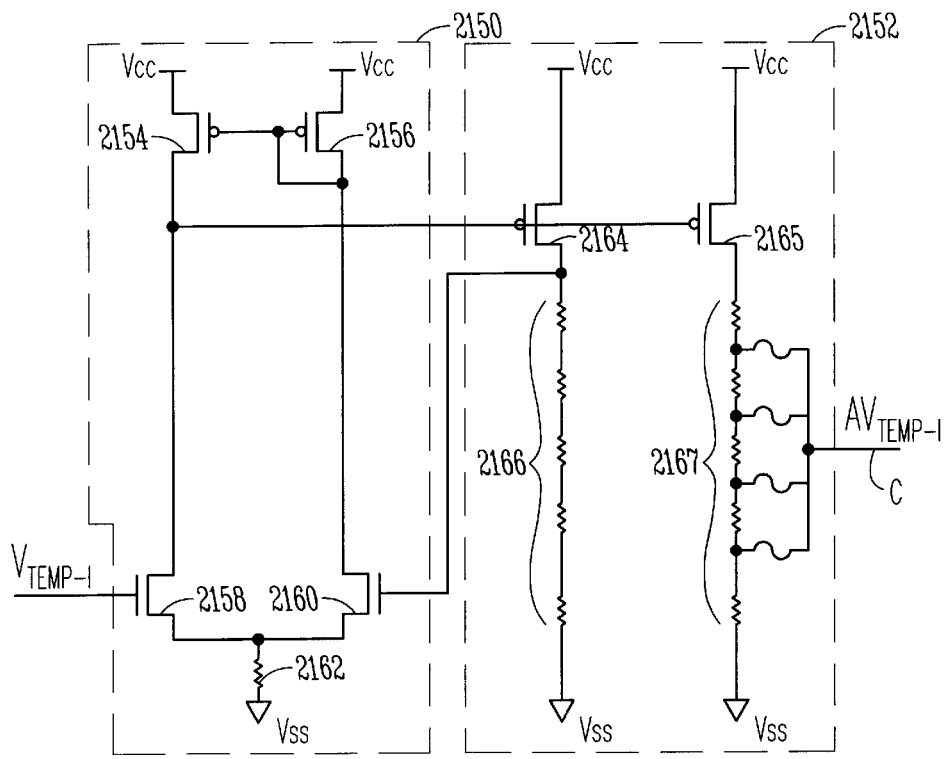
FIG. 21C illustrates one embodiment of the fractional multiplier provided in FIG. 21B.

FIG. 21C illustrates one embodiment of the fractional multiplier provided in FIG. 21B. According to this embodiment, the fractional multiplier 2123 includes a differential amplifier 2150, an output stage 2152, and feedback control. The differential amplifier 2150 includes first and second PMOS transistors 2154 and 2156 coupled to $V_{CC}$ in a current mirror configuration. The differential amplifier 2150 also includes first and second NMOS transistors 2158 and 2160, each of which are coupled between one of the PMOS transistors and a pull-down resistor 2162. In one embodiment, the output stage 2152 of the comparator 2110 comprises a PMOS pull-up transistor 2164 coupled to a pull-down transistor stack 2166. A second PMOS pull-up transistor 2165 is coupled to a second pull down resistor stack 2167. The gates of the PMOS transistors 2164 and 2165 are coupled to, and thus both are controlled by, the node between the first PMOS transistor 2154 and the first NMOS transistor 2158 in the differential amplifier 2150.

The gate of the first NMOS transistor 2158 is connected to the bandgap reference generator 2122 and thus receives the temperature-independent voltage $V_{TEMP-I}$. The gate of the second NMOS transistor 2160 is connected to the resistor stack 2166 of the output stage 2152. The second resistor stack 2167 may contain laser trimmable devices, fuses, antifuses and/or transistors. In the illustrated example, the resistor stacks 2166 and 2167 include a plurality of resistors coupled in series between the transistors 2164 and 2165, respectively, and $V_{SS}$. Fuses are connected from nodes between the resistors of the second resistor stack 2165 to node C. Unblown fuses provide an electrical connection to node C, and a blown fuse breaks this connection forcing current to flow through the resistors. The value of the fractional multiplier is determined by the arrangement of blown and unblown fuses. As one skilled in the art would understand, other designs may be used for the fractional multiplier.

FIGS. 22A and 22B illustrate the hysteresis effect that the shunt transistor 2152 of FIG. 21A has on the operation of the charge pump 2108. Thus, when applied to the circuit of FIG. 21A, the inclusion of hysteresis causes the circuit to require a lower threshold voltage $V_T$ ($V_{Tmin}$) to turn the charge pump on and a higher threshold voltage $V_T$ ($V_{Tmax}$) to turn the charge pump off. This is beneficial to reduce On/Off cycles in the charge pump, which reduces power drain.

Otherwise, the charge pump could be turning on and off almost continuously. The difference between $V_{Tmax}$ and $V_{Tmin}$, however, is small enough so as not to adversely affect the stability of the memory cells in the LL4TCMOS SRAM array.

Referring to FIG. 22A, it is illustrated that the charge pump will turn off when $V_T > V_{BG} - V_{STACK(on)}$; i.e. when the threshold voltage $V_T$ increases to $V_{T(OFF)}$ due to the effect of the charge pump or a decrease in temperature. Referring to FIG. 22B, it is illustrated that the charge pump will turn on when $V_T < V_{BG} - V_{STACK(off)}$; i.e. when the threshold voltage $V_T$ decreases to $V_{T(on)}$ due to the effect of an increase in temperature. It is noted that $V_{BG}$, $V_{STACK(on)}$ and $V_{STACK(off)}$ are temperature independent voltages, and that $V_T$ is variable that oscillates between $V_{Tmin}$ and $V_{Tmax}$. $V_{T(off)}$ corresponds to $V_{Tmax}$, and $V_{T(on)}$ corresponds to $V_{Tmin}$.

FIG. 23 illustrates the hysteresis effect that the shunt transistor of FIG. 21A has on the operation of the charge pump 2108. FIG. 23 illustrates the relationship between the threshold voltage $V_T$ and the body bias voltage $V_{BB}$. The charge pump cycles between Pump On 2305 and Pump Off 2310 states as the threshold voltage $V_T$ oscillates between a $V_{Tmax}$ and a $V_{Tmin}$. After the threshold voltage reaches the $V_{Tmin}$, the charge pump will turn on and will continue to charge the body terminal 2104 of the pull-down transistors 2106 until the threshold voltage reaches the $V_{Tmax}$. Upon reaching the $V_{Tmax}$, the charge pump will turn off until the threshold voltage reaches the $V_{Tmin}$. Hysteresis could also be incorporated into the circuit of FIG. 21B.

Figure 24:
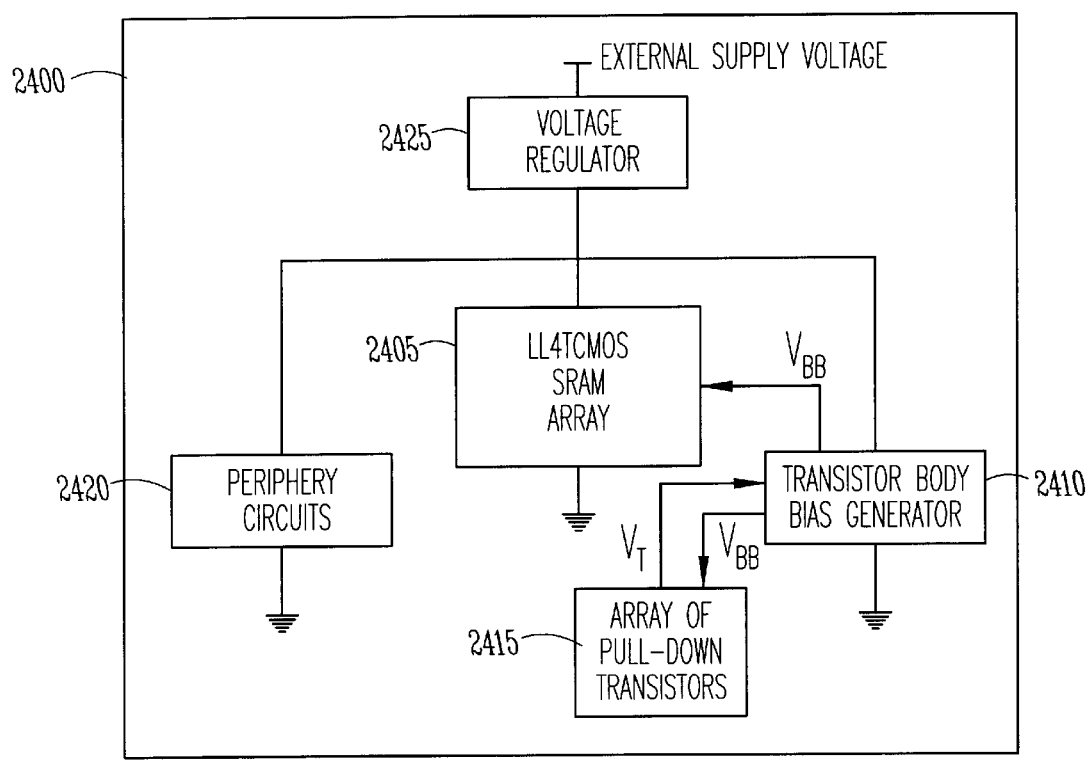
FIG. 24 illustrates a block diagram of a memory circuit.

FIG. 24 illustrates a block diagram of a memory circuit 2400. The memory circuit 2400, or memory device, comprises a SRAM array 2405 and a transistor body bias generator 2410, as described in connection with FIGS. 21A and 21B according to the teachings of the present invention. According to one embodiment, the circuit 2400 includes an array or bank of pull-down transistors 2415. According to one embodiment, the bank of transistors are fabricated with the transistors used in the SRAM array. The number and type of the transistors in the bank of transistors varies according to the embodiment.

The transistor bias generator 2410 reads the $V_T$ from the array of pull-down transistors 2415 and biases the array or bank of pull-down transistors 2415 with $V_{BB}$. The transistor bias generator 2410 uses this $V_T$ to bias the SRAM array with $V_{BB}$.

According to one embodiment, the SRAM array and the bank of transistors 2415 are triple-well transistors that have an isolated body region. As such, in this embodiment, only the SRAM array is temperature-compensated and other circuits on the die are not temperature-compensated.

In one embodiment, the SRAM array is an LL4TCMOS SRAM array. The transistor body bias generator 2410 is coupled to the bank 2415 of pull-down transistors and to the SRAM array to both detect the threshold voltage $V_T$ of the array, or a $V_T$-dependent voltage, and to charge the body of the pull-down transistors within the array when the threshold voltage $V_T$ drops below a minimum level.

According to one embodiment, the entire die that includes the LL4TCMOS SRAM array is temperature-compensated along with the LL4TCMOS SRAM array. According to another embodiment, the LL4TCMOS SRAM array and the bank of transistors 2415 are triple-well transistors, such that the LL4TCMOS SRAM array is temperature-compensated and other circuits on the die are not temperature-compensated.

According to various embodiments, the memory device 2400 further includes periphery circuits 2420 and a voltage regulator 2425. In one embodiment, the periphery circuits 2420 include output circuits, input circuits, sense amplifier circuits, write drivers, address registers, burst counters and control. In other embodiments, other or additional circuits form the periphery circuits 2420. The voltage regulator 2425 provides a regulated supply voltage to the memory array 2405, the bias generator 2410 and the periphery circuits 2420.

Figure 25:
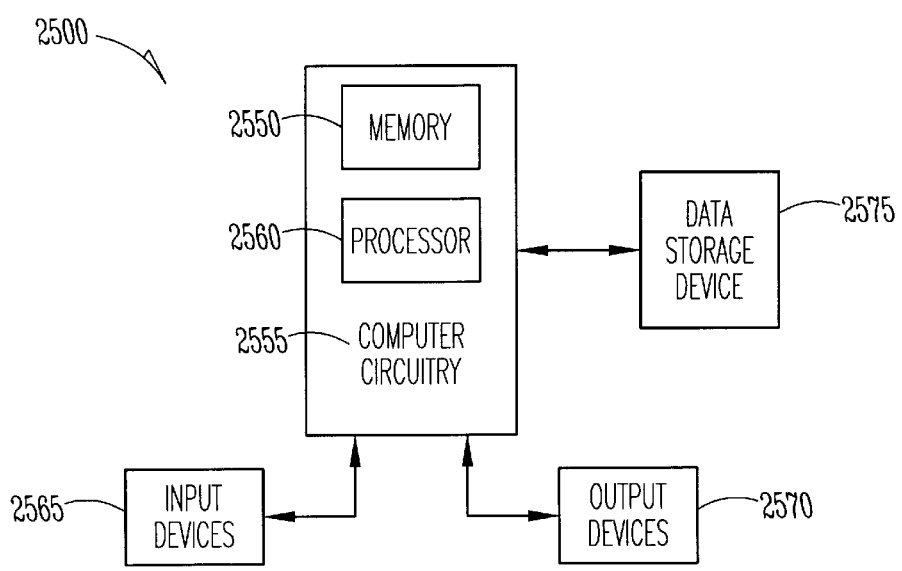
FIG. 25 illustrates a block diagram of a computer system.

FIG. 25 illustrates a block diagram of an electronic system 2500, such as a computer system, that incorporates the memory device 2550 having a body bias generator according to the teachings of the present invention. The system includes computer circuitry 2555 for performing computer functions, such as executing software to perform desired calculations and tasks. The circuitry includes a processor 2560 and the memory circuit 2550, which is coupled to the processor 2560. One or more input devices 2565, such as a keyboard or a mouse, are coupled to the computer circuitry 2555 and allow data to be input into the system. One or more output devices 2570 are coupled to the computer circuitry 2555 to provide data generated by the computer circuitry. Examples of output devices 2570 include a printer and a video display unit. One or more data storage devices 2575 are coupled to the computer circuitry 2555 to store data on or retrieve data from external storage media. Examples of the storage devices and the corresponding storage media include drives that accept hard and floppy disks, tape cassettes, and compact disk read-only memories (CD ROMS).

The figures presented and described in detail above are similarly useful in describing the method aspects of the present subject matter. The methods described below are nonexclusive as other methods may be understood from the specification and the figures described above.

One aspect provides a method of providing a temperature-compensated pull-down threshold voltage $V_T$ for at least one transistor. The method comprises determining whether a $V_T$-dependent voltage is less than a first temperature-independent voltage that corresponds to a $V_{Tmin}$ or more than a second temperature-independent voltage that corresponds to a $V_{Tmax}$. In response to determining that the $V_T$-dependent voltage is less than the first temperature-independent voltage that corresponds to the $V_{Tmin}$, a transistor body terminal of the at least one transistor is charged until the $V_T$-dependent voltage is more than the second temperature-independent voltage that corresponds to the $V_{Tmax}$. The charging is ceased upon reaching the $V_{Tmax}$. In one embodiment, the first temperature-independent voltage equals the second temperature-independent voltage; i.e. $V_{Tmin} = V_{Tmax}$ in a case where hysteresis is not used. In another embodiment, the first temperature-independent voltage is less than the second temperature-independent voltage; i.e. $V_{Tmin} < V_{Tmax}$.

One embodiment of the method further comprises providing a bandgap reference to generate a constant temperature-independent reference voltage $V_{BG}$ and providing a current source and a resistor stack. The current source has a current source temperature coefficient, and the resistor stack has a resistor stack temperature coefficient. The current source temperature coefficient and the resistor stack temperature coefficient offset such that the current source and the resistor stack produce a temperature-independent voltage drop $V_{STACK}$. The resistor stack comprises at least one resistor connected in parallel with a shunt transistor such that, when the transistor body is being charged, an active shunt transistor provides $V_{STACK(ON)}$. According to the teachings of the present invention, when the transistor body is not being charged, an inactive shunt transistor provides $V_{STACK(OFF)}$. The method includes providing a first temperature-independent voltage defined by $V_{BG}-V_{STACK(ON)}$, and a second temperature-independent voltage defined by $V_{BG}-V_{STACK(OFF)}$.

In one embodiment, the method includes providing a comparator having a first input, a second input, and an output. A $V_T$-dependent voltage is received at the first input of the comparator, and a temperature-independent reference voltage is received at the second input of the comparator. According to the teaching of the present invention, a control signal indicative of whether the $V_T$-dependent voltage is less than the first temperature-independent voltage is generated at the output of the comparator.

Conclusion

The present subject matter provides a circuit with a transistor having a temperature-compensated threshold voltage, i.e. $V_T$. According to one embodiment, a low-voltage LL4TCMOS SRAM array is temperature compensated. The LL4TCMOS SRAM array has cells that include NMOS pull-down transistors with a temperature-compensated $V_{TN}$. According to one embodiment, each NMOS pull-down transistor within the array comprises a triple-well transistor with an isolated body region, and the voltage threshold $V_T$ thereof is adjusted to compensate for changes in temperature. A temperature-based modulation of a $V_{BB}$ potential back-biases the P-well of the triple-well transistor with a temperature-compensated voltage to provide the pull-down transistor with a flat, or relatively flat, $V_{TN}$ with respect to temperature. Thus, the temperature-compensated $V_{TN}$ of the LL4TCMOS SRAM cells will maintain the appropriate margins to avoid failure at low-voltage operation. According to another embodiment, the transistors of the LL4TCMOS SRAM array do not have isolated body regions such that the entire die is temperature-compensated.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of providing a temperature-compensated pull-down threshold voltage $V_T$, comprising:
   comparing a controlled temperature-based voltage reference to a $V_T$-based voltage; and
   generating a temperature-compensated bias voltage for a transistor body terminal based on the comparison between the temperature-based voltage reference and the $V_T$-based voltage.

2. The method of claim 1, wherein comparing a controlled temperature-based voltage reference to a $V_T$-based voltage includes comparing a temperature-independent voltage reference to a $V_T$-based voltage.

3. The method of claim 1, wherein comparing a controlled temperature-based voltage reference to a $V_T$-based voltage includes comparing a controlled temperature-dependent voltage reference to a $V_T$-based voltage.

4. The method of claim 3, wherein comparing a controlled temperature-dependent voltage reference to a $V_T$-based voltage includes comparing a voltage reference with reduced temperature dependence with positive or negative slope (RTDWPNS reference voltage) to a $V_T$-based voltage.

5. The method of claim 1, wherein generating a temperature-compensated bias voltage for a transistor body terminal includes charging the transistor body terminal to increase the $V_T$-based voltage when the temperature-based voltage reference is larger than the $V_T$-based voltage.

6. The method of claim 5, wherein comparing a controlled temperature-based voltage reference to a $V_T$-based voltage includes adjusting the $V_T$-based voltage based on whether the transistor body terminal is being charged to provide a hysteresis effect in compensating the pull-down threshold voltage $V_T$.

7. A method of providing a temperature-compensated pull-down threshold voltage $V_T$, comprising:
   comparing a controlled temperature-based voltage reference to a $V_T$-dependent voltage, including determining whether the $V_T$-dependent voltage is less than a first reference voltage that corresponds to a $V_{Tmin}$ or more than a second reference voltage that corresponds to a $V_{Tmax}$; and
   generating a temperature-compensated bias voltage for a transistor body terminal based on the comparison between the temperature-based voltage reference and the $V_T$-dependent voltage, including charging the transistor body terminal of a triple-well transistor until the $V_T$-dependent voltage is more than the second reference voltage that corresponds to the $V_{Tmax}$ in response to determining that the $V_T$-dependent voltage is less than the first reference voltage that corresponds to the $V_{Tmin}$.

8. The method of claim 7, wherein at least one of the first reference voltage and the second reference voltage include a temperature-independent reference voltage.

9. The method of claim 7, wherein at least one of the first reference voltage and the second reference voltage include a voltage reference with reduced temperature dependence with positive or negative slope (RTDWPNS reference voltage).

10. A method of providing a temperature-compensated pull-down threshold voltage $V_T$, comprising:
   comparing a controlled temperature-based voltage reference to a $V_T$-dependent voltage, including:
      providing a comparator having a first input, a second input and an output;
      receiving the $V_T$-dependent voltage at the first input of the comparator;
      receiving the controlled temperature-based voltage reference at the second input of the comparator; and
      providing a control signal indicative based on the comparison between the controlled temperature-based voltage reference to the $V_T$-dependent voltage; and
   generating a temperature-compensated bias voltage for a transistor body terminal based on the comparison between the temperature-based voltage reference and the $V_T$-dependent voltage, including:
      providing a charge pump to receive the control signal and coupling the charge pump to a number of transistor body terminals; and in response to receiving the control signal at the charge pump, using the charge pump to charge the number of transistor body terminals.

11. The method of claim 10, wherein the controlled temperature-based reference includes a temperature-independent reference voltage.

12. The method of claim 10, wherein the controlled temperature-based reference includes a voltage reference with reduced temperature dependence with positive or negative slope (RTDWPNS reference voltage).

13. The method of claim 10, wherein comparing a controlled temperature-based voltage reference to a $V_T$-based voltage includes adjusting the $V_T$-based voltage based on whether the transistor body terminal is being charged to provide a hysteresis effect in compensating the pull-down threshold voltage $V_T$.

14. The method of claim 10, wherein:
providing a control signal indicative based on the comparison between the controlled temperature-based voltage reference to a $V_T$-dependent voltage includes providing a control signal indicative of whether the $V_T$-dependent voltage is less than a first reference voltage or more than a second reference voltage; and
in response to receiving the control signal at the charge pump, using the charge pump to charge the number of transistor body terminals includes:
in response to receiving a control signal indicating that the $V_T$-dependent voltage is less than the first reference voltage, charging the body terminal; and
in response to receiving a control signal indicating that the $V_T$-dependent voltage is more than the second reference voltage, ceasing to charge the body terminal.

15. A method of providing a temperature-compensated pull-down threshold voltage $V_T$, comprising:
determining whether a $V_T$-dependent voltage is less than a first reference voltage with reduced temperature dependence with positive or negative slope (RTDWPNS reference voltage) or more than a second reference voltage with reduced temperature dependence with positive or negative slope (RTDWPNS reference voltage); and
in response to determining that the $V_T$-dependent voltage is less than the first reference voltage that corresponds to the $V_{Tmin}$, charging a transistor body terminal until the $V_T$-dependent voltage is more than the second reference voltage that corresponds to the $V_{Tmax}$.

16. A method of providing a temperature-compensated pull-down threshold voltage $V_T$ for at least one transistor, comprising:
providing at least one triple-well transistor, wherein each triple-well transistor includes:
a p-substrate;
a p-well isolated from the p-substrate by an n-tub electrically coupled to an n-well;
an NMOS transistor formed within the isolated p-well;
an n+ contact for the n-well; and
a $V_{BB}$ p+ contact for the p-well, wherein the $V_{BB}$ p+ contact functions as a body terminal;
determining whether a $V_T$-dependent voltage is less than a first reference voltage that corresponds to a $V_{Tmin}$ or more than a second reference voltage that corresponds to a $V_{Tmax}$; and
in response to determining that the $V_T$-dependent voltage is less than the first reference voltage that corresponds to the $V_{Tmin}$, charging the transistor body terminal of each of the plurality of triple-well transistors until the $V_T$-dependent voltage is more than the second reference voltage that corresponds to the $V_{Tmax}$.

17. A method of providing a temperature-compensated pull-down threshold voltage $V_T$ for a memory array, comprising:
providing an LL4TCMOS SRAM array that includes a plurality of transistors with a body terminal and a threshold voltage $V_T$;
determining whether a $V_T$-dependent voltage is less than a first reference voltage that corresponds to a $V_{Tmin}$ or more than a second reference voltage that corresponds to a $V_{Tmax}$; and
in response to determining that the $V_T$-dependent voltage is less than the first reference voltage that corresponds to the $V_{Tmin}$, charging the transistor body terminal of each of the plurality of transistors until the $V_T$-dependent voltage is more than the second reference voltage that corresponds to the $V_{Tmax}$.

18. A method of providing a temperature-compensated pull-down threshold voltage $V_T$ for a memory array, comprising:
providing an LL4TCMOS SRAM array that includes a plurality of triple-well transistors, wherein each triple-well transistor includes:
a p-substrate;
a p-well isolated from the p-substrate by an n-tub electrically coupled to an n-well;
an NMOS transistor formed within the isolated p-well;
an n+ contact for the n-well; and
a $V_{BB}$ P+ contact for the p-well, wherein the $V_{BB}$ p+ contact functions as a body terminal;
determining whether a $V_T$-dependent voltage is less than a first reference voltage that corresponds to a $V_{Tmin}$ or more than a second reference voltage that corresponds to a $V_{Tmax}$; and
in response to determining that the $V_T$-dependent voltage is less than the first reference voltage that corresponds to the $V_{Tmin}$, charging the transistor body terminal of each of the plurality of triple-well transistors until the $V_T$-dependent voltage is more than the second reference voltage that corresponds to the $V_{Tmax}$.

19. A method of providing a temperature-compensated pull-down threshold voltage $V_T$ for a memory array, comprising:
providing a comparator having a first input, a second input, and an output;
providing a charge pump;
coupling the charge pump to the comparator and to a body terminal of each pull-down transistor contained within an array of pull-down transistors in the memory array;
receiving a $V_T$-dependent voltage at the first input of the comparator;
receiving a reference voltage with reduced temperature dependence with positive or negative slope (RTDWPNS reference voltage) at the second input of the comparator;
providing a control signal to the charge pump, wherein the control signal is indicative of whether the $V_T$-dependent voltage is less than a first reference voltage or more than a second reference voltage;
in response to receiving a control signal indicating that the $V_T$-dependent voltage is less than the first reference voltage, charging the body terminal of each pull-down transistor contained within an array of pull-down transistors in the memory array; and in response to receiving a control signal indicating that the $V_T$-dependent voltage is more than the second reference voltage, ceasing to charge the body terminal of each pull-down transistor contained within an array of pull-down transistors in the memory array.

20. A method of forming a transistor body bias generator, comprising:

providing a charge pump with an output adapted to couple to a body terminal of at least one transistor;

providing a comparator with a first input, a second input and an output;

coupling the first input to a reference voltage with reduced temperature dependence with positive or negative slope (RTDWPNS reference voltage);

coupling the second input to a $V_T$-dependent voltage; and coupling the output to the charge pump to present a control signal to the charge pump, wherein the charge pump is adapted to compensate for temperature changes by selectively charging the body terminal of the at least one transistor in response to the control signal.

21. A method of forming a memory array, comprising:

providing a plurality of triple-well transistors having a body terminal and a threshold voltage $V_T$;

providing a comparator having a first input, a second input, and an output;

providing a charge pump;

coupling the charge pump to the body terminal of each of the plurality of triple-well transistors;

coupling a $V_T$-dependent voltage at the first input of the comparator;

coupling a reference voltage at the second input of the comparator; and coupling the output of the comparator to the charge pump such that the charge pump is controlled by a control signal based on a comparison between the $V_T$-dependent voltage and the reference voltage.

22. A method of forming a memory array, comprising:

providing a bank of transistors having a body terminal and a threshold voltage $V_T$;

providing a memory array, including providing a plurality of transistors having a body terminal;

providing a comparator having a first input, a second input, and an output;

providing a charge pump;

coupling the charge pump to the body terminal for the bank of transistors and to the body terminal of each of the plurality of transistors in the memory array;

coupling a $V_T$-dependent voltage from the bank of transistors to the first input of the comparator;

coupling a reference voltage at the second input of the comparator; and coupling the output of the comparator to the charge pump such that the charge pump is controlled by a control signal based on a comparison between the $V_T$-dependent voltage and the reference voltage.

23. A method-of forming a memory array, comprising:

providing a bank of transistors having a body terminal and a threshold voltage $V_T$;

providing a LL4TCMOS SRAM array, including providing a plurality of transistors having a body terminal;

providing a comparator having a first input, a second input, and an output;

providing a charge pump;

coupling the charge pump to the body terminal for the bank of transistors and to the body terminal of each of the plurality of transistors in the LL4TCMOS SRAM array;

coupling a $V_T$-dependent voltage from the bank of transistors to the first input of the comparator;

coupling a reference voltage at the second input of the comparator; and coupling the output of the comparator to the charge pump such that the charge pump is controlled by a control signal based on a comparison between the $V_T$-dependent voltage and the reference voltage.

24. A method of forming a memory array, comprising:

providing a bank of triple-well transistors having a body terminal and a threshold voltage $V_T$;

providing a LL4TCMOS SRAM array, including providing a plurality of triple-well transistors having a body terminal;

providing a comparator having a first input, a second input, and an output;

providing a charge pump;

coupling the charge pump to the body terminal for the bank of triple-well transistors and to the body terminal of each of the plurality of triple-well transistors in the LL4TCMOS SRAM array;

coupling a $V_T$-dependent voltage from the bank of triple-well transistors to the first input of the comparator;

coupling a reference voltage at the second input of the comparator; and coupling the output of the comparator to the charge pump such that the charge pump is controlled by a control signal based on a comparison between the $V_T$-dependent voltage and the reference voltage.

* * * * *

UNITED STATES PATENT AND TRADEMARK OFFICE
CERTIFICATE OF CORRECTION

PATENT NO. : 6,809,968 B2
DATED : October 26, 2004
INVENTOR(S) : Marr et al.

It is certified that error appears in the above-identified patent and that said Letters Patent is hereby corrected as shown below:

Title page,
Item [56], References Cited, U.S. PATENT DOCUMENTS, delete "365/189.02" and insert -- 365/189.09 --, therefor.
OTHER PUBLICATIONS,
"Noda" reference, delete "," before "Meeting".

Column 8,
Line 57, after "unstable" insert -- memory cell and an accidental write. As illustrated in Figure 11 A, if the NMOS --.

Column 11,
Line 49, below "voltage" delete "$V_T = V_{TO} + \gamma[\sqrt(2\phi_b + |V_{sb}|) - \sqrt(2\phi_b)]$" and insert -- $V_T = V_{T0} + \gamma[\sqrt{(2\phi_b + |V_{sb}|)} - \sqrt{(2\phi_b)}]$ --, therefor.

Column 24,
Line 8, delete "method-of" and insert -- method of --, therefor.

Signed and Sealed this

Third Day of May, 2005

JON W. DUDAS
*Director of the United States Patent and Trademark Office*